United States Patent
Ramaswamy

(10) Patent No.: US 11,107,724 B2
(45) Date of Patent: *Aug. 31, 2021

(54) METHODS OF FORMING INTEGRATED ASSEMBLIES

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/995,529

(22) Filed: Aug. 17, 2020

(65) Prior Publication Data
US 2020/0381290 A1 Dec. 3, 2020

Related U.S. Application Data

(62) Division of application No. 16/659,486, filed on Oct. 21, 2019, now Pat. No. 10,770,343, which is a
(Continued)

(51) Int. Cl.
*H01L 27/00* (2006.01)
*H01L 21/764* (2006.01)
*H01L 27/08* (2006.01)
*H01L 49/02* (2006.01)
*H01L 27/11507* (2017.01)
(Continued)

(52) U.S. Cl.
CPC ........ *H01L 21/764* (2013.01); *H01L 27/0805* (2013.01); *H01L 28/90* (2013.01);
(Continued)

(58) Field of Classification Search
None
See application file for complete search history.

(56) References Cited

U.S. PATENT DOCUMENTS 5,612,238 A 3/1997 Sato et al.
10,475,697 B2 * 11/2019 Ramaswamy ........ H01L 21/764
(Continued)

FOREIGN PATENT DOCUMENTS

KR 10-2014-0143930 12/2014
TW 201108399 3/2011
(Continued)

OTHER PUBLICATIONS

WO PCT/US2017/065993 Search Rept., dated Mar. 30, 2018, Micron Technology, Inc.
(Continued)

*Primary Examiner* — Reema Patel
(74) *Attorney, Agent, or Firm* — Wells St. John P.S.

(57) ABSTRACT

Some embodiments include an integrated memory having an array of capacitors. The array has edges. The capacitors along the edges are edge capacitors, and the other capacitors are internal capacitors. The edge capacitors have inner edges facing toward the internal capacitors, and have outer edges in opposing relation to the inner edges. An insulative beam extends laterally between the capacitors. The insulative beam is along upper regions of the capacitors. First void regions are under the insulative beam, along lower regions of the internal capacitors, and along the inner edges of the edge capacitors. Peripheral extensions of the insulative beam extend laterally outward of the edge capacitors, and second void regions are under the peripheral extensions and along the outer edges of the edge capacitors. Some embodiments included integrated assemblies having two or more memory array decks stacked on atop another. Some embodiments include methods of forming memory arrays.

15 Claims, 19 Drawing Sheets

Related U.S. Application Data division of application No. 15/982,949, filed on May 7, 2018, now Pat. No. 10,475,697, which is a division of application No. 15/400,886, filed on Jan. 6, 2017, now Pat. No. 10,020,360.

(51) Int. Cl.
*H01L 27/108* (2006.01)
*H01L 27/11504* (2017.01)

(52) U.S. Cl.
CPC ... *H01L 27/10808* (2013.01); *H01L 27/11504* (2013.01); *H01L 27/11507* (2013.01)

(56) References Cited

U.S. PATENT DOCUMENTS

| | | |
|---|---|---|
| 2008/0283816 A1 | 11/2008 | Takaishi |
| 2011/0042722 A1 | 2/2011 | Renn et al. |
| 2011/0221034 A1 | 9/2011 | Kawakita |
| 2013/0011988 A1 | 1/2013 | Sako |
| 2014/0029340 A1 | 1/2014 | Wang |
| 2014/0361403 A1 | 12/2014 | Cho |
| 2018/0025768 A1 | 1/2018 | Hush |

FOREIGN PATENT DOCUMENTS

| | | |
|---|---|---|
| TW | 201620078 | 6/2016 |
| TW | 106145622 | 10/2018 |
| TW | 106145622 | 4/2019 |
| WO | PCT/US2017/065993 | 7/2019 |

OTHER PUBLICATIONS

WO PCT/US2017/065993 Writ. Opin., dated Mar. 30, 2018, Micron Technology, Inc.

* cited by examiner

METHODS OF FORMING INTEGRATED ASSEMBLIES

RELATED PATENT DATA

This patent resulted from a divisional of U.S. patent Ser. No. 16/659,486 filed Oct. 21, 2019, which is a divisional of U.S. patent application Ser. No. 15/982,949 filed May 17, 2018, which is a divisional of U.S. patent application Ser. No. 15/400,886, which was filed Jan. 6, 2017, and which is hereby incorporated herein by reference.

TECHNICAL FIELD

Integrated memory, integrated assemblies, and methods of forming memory arrays. The memory arrays may include memory cells which individually comprise capacitors and transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines (i.e., wordlines) may conductively interconnect memory cells along rows of the array. Each memory cell may be uniquely addressed through the combination of a digit line and an access line.

Memory cells may be volatile or nonvolatile. Nonvolatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on the composition of the insulator material, the stored field will be volatile or nonvolatile. For example, a capacitor insulator material including only $SiO_2$ will be volatile. One type of nonvolatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is nonvolatile due to the bi-stable characteristics of the ferroelectric material that forms a part of the capacitor. Other programmable materials may be used as capacitor insulator to render capacitors nonvolatile.

DETAILED DESCRIPTION OF THE ILLUSTRATED EMBODIMENTS

Some embodiments include integrated memory having memory cells comprising capacitors. The capacitors are arranged in an array. Void regions are provided between the capacitors of the array to provide isolation between neighboring capacitors. Void regions may provide better isolation between neighboring capacitors as compared to solid or semisolid insulative materials. Specifically, if solid or semisolid insulative materials are utilized, there may be problematic capacitive coupling across neighboring capacitors. The capacitive coupling may cause data loss from memory cells due to the capacitive states of the memory cell capacitors being disturbed as neighboring capacitors are programmed or otherwise accessed. Utilization of void regions between neighboring capacitors may alleviate, or even entirely prevent the problematic capacitive coupling across neighboring capacitors. In some embodiments, the capacitors may comprise ferroelectric insulative material, and in some embodiments the capacitors may comprise only non-ferroelectric insulative material.

Some embodiments include integrated assemblies having stacked memory array decks. The decks differ from one another in either the type of capacitors utilized (e.g., one of the decks may utilize capacitors having ferroelectric insulative material, and the other of the decks may utilize capacitors having only non-ferroelectric insulative material) and/or in an arrangement of capacitors and transistors (e.g., one of the decks may have a 1T1C arrangement and the other may have a 2T1C arrangement, a 2T2C arrangement, etc.)

Some embodiments include methods of forming memory arrays which have void regions between neighboring capacitors.

Example embodiments are described with reference to FIGS. 1-21.

Figure 1:
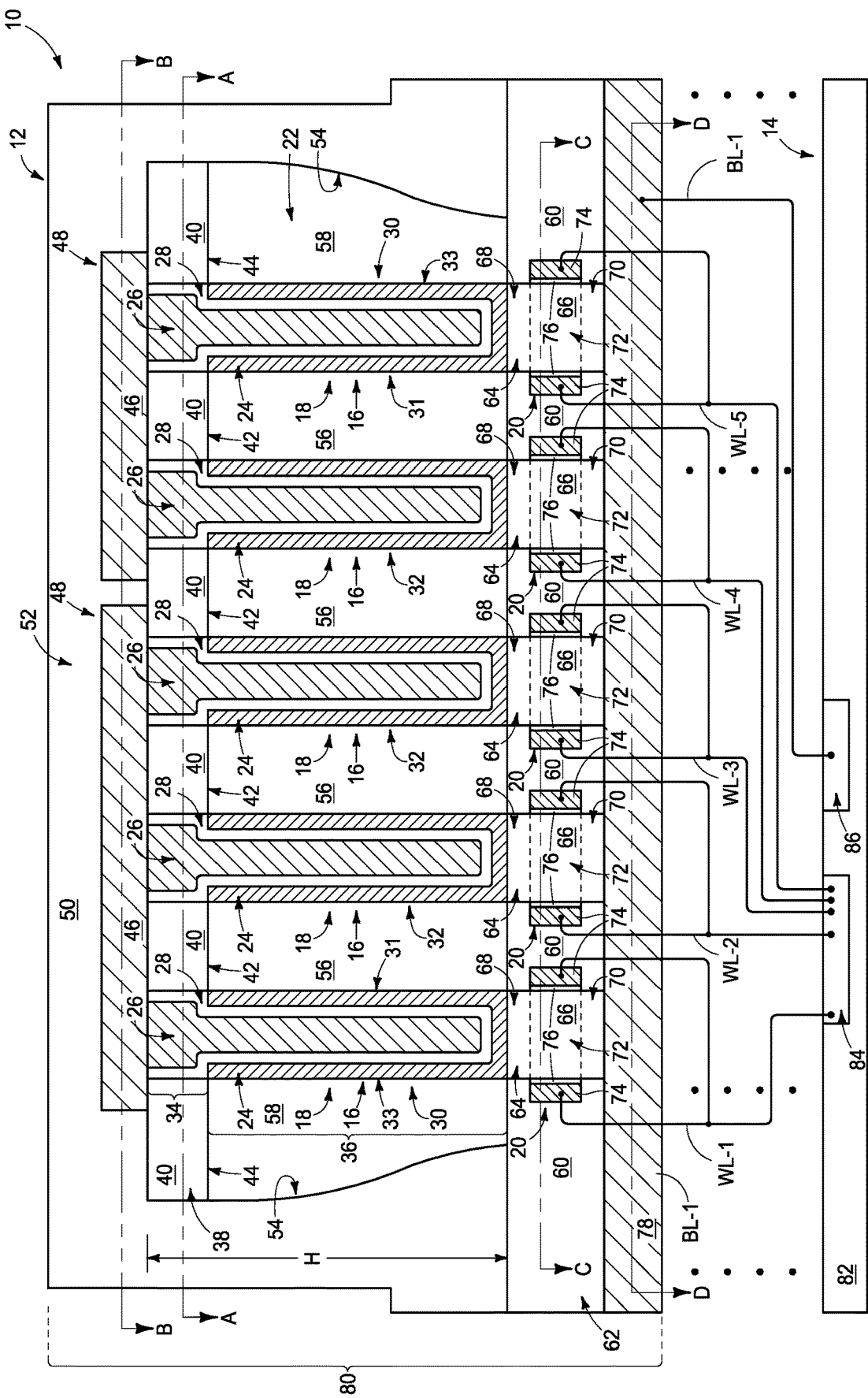
FIG. 1 is a diagrammatic cross-sectional side view of an example integrated structure having a portion of an example memory array supported over a region peripheral to the memory array.

Referring to FIG. 1, a construction 10 comprises portion of a memory array region 12, over a portion of a region 14. The region 14 may be considered to be peripheral to the memory array region 12. The peripheral region 14 is shown to be spaced from the memory array region 12 by a gap. Such gap is utilized to indicate that there may be other materials or structures between the peripheral region 14 and the memory array region 12 in some embodiments. Although the peripheral region 14 is shown to be under the memory array region 12, in other embodiments at least a portion of the peripheral region 14 may be beside the memory array region 12 and/or at least a portion of the peripheral region 14 may be over the memory array region 12.

The memory array region 12 includes a plurality of memory cells 16. Each of the memory cells 16 includes a capacitor 18 over and electrically coupled with a transistor 20. The memory cells 16 (e.g., capacitors 18 and transistors 20) are arranged within an array 22.

Each of the capacitors 18 includes a first electrode 24, a second electrode 26, and a capacitor insulative material 28 between the first and second electrodes 24/26.

The first electrodes 24 may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first electrodes 24 may comprise, consist essentially of, or consist of titanium nitride.

The second electrodes 26 may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second electrodes 26 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

Although the first and second electrodes 24/26 are shown to be homogeneous in the embodiment of FIG. 1, it is to be understood that either or both of the electrodes 24 and 26 may instead comprise two or more different materials.

The first and second electrodes 24/26 may comprise any suitable thicknesses; and in some embodiments may comprise thicknesses within a range of from about 20 Å to about 100 Å.

The capacitor insulative material 28 may comprise any suitable composition or combination of compositions. For instance, in some embodiments the capacitor insulative material 28 may comprise, consist essentially of, or consist of non-ferroelectric insulative material; such as, for example, one or more of silicon dioxide, silicon nitride, high-k dielectric (for instance, aluminum oxide, hafnium oxide, zirconium oxide, etc.). In some embodiments, at least some of the capacitor insulative material 28 may comprise ferroelectric insulative material. The ferroelectric insulative material may include one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element.

In embodiments in which the capacitor insulative material comprises only non-ferroelectric compositions, the memory cells 16 may be volatile (e.g., the capacitors 18 may have operational characteristics corresponding to the volatile characteristics associated with traditional dynamic random access memory (DRAM)).

In embodiments in which the capacitor insulative material comprises one or more ferroelectric compositions, the memory cells 16 may be nonvolatile, or at least may have reduced volatility as compared to the volatility associated with traditional DRAM.

In embodiments in which the capacitor insulative material 28 comprises a ferroelectric composition, the array 22 may be referred to as ferroelectric memory; and in embodiments in which the capacitor insulative material 28 comprises only one or more non-ferroelectric compositions, the array 22 may be referred to as non-ferroelectric memory.

Although the capacitor insulative material 28 is shown to be homogeneous in the embodiment of FIG. 1, it is to be understood that the capacitor insulative material 28 may instead comprise two or more different compositions.

The capacitor insulative material 28 may comprise any suitable thickness, and in some embodiments may comprise a thickness within a range of from about 30 Å to about 100 Å.

The capacitors 18 may be formed to any suitable height, H; such as, for example, a height within a range of from about 200 nanometers (nm) to about 1500 nm.

The illustrated capacitors 18 are container-type capacitors (i.e., the first electrode 24 of each capacitor is shaped as an upwardly-opening container, and the insulative 28 and second electrode 26 extend into such upwardly-opening container). In other embodiments, the capacitors 18 may have other configurations, such as, for example stud capacitor configurations.

Two of the capacitors 18 along the cross-section of FIG. 1 are shown to be at edges of the array 22, and such capacitors may be referred to as edge capacitors 30. The remaining capacitors 18 may be referred to as internal capacitors 32, as such remaining capacitors are internal within the array 22 rather than being at the edges of the array. Accordingly, all of the capacitors of array 22 may be referred to as capacitors 18; or the group of capacitors 18 may be broken into subgroups, with one of such subgroups being the edge capacitors 30 and the other of the subgroups being the internal capacitors 32. The edge capacitors 30 may be structurally identical to the internal capacitors 32 in all respects except that the edge capacitors 30 are along edges of the array 22 and the internal capacitors 32 are not along the edges of the array 22.

The edge capacitors 30 may be considered to have inner edges 31 facing the internal capacitors 32, and to have outer edges 33 in opposing relation to the inner edges 31.

All of the capacitors 18 may be considered to have upper regions 34 and lower regions 36 (the regions 34/36 are illustrated relative to one of the edge capacitors 30, but it is to be understood that all of the capacitors 18 comprise similar regions 34/36).

An insulative beam 38 extends laterally between the capacitors 18, and is along the upper regions 34 of the capacitors 18. The insulative beam 38 comprises a material 40. Such material 40 may be any suitable insulative composition or combination of insulative compositions; including, for example, silicon dioxide, silicon nitride, aluminum oxide, etc. The material 40 may be homogenous (as shown), or may comprise two or more discrete compositions.

The insulative beam 38 has a central region 42 which extends between the capacitors 18, and has peripheral extensions 44 which extend laterally outward of the edge capacitors 30. In some applications, the insulative beam 38 may be considered to be a lattice structure which supports the capacitors 18 (for instance, which may alleviate or prevent undesired toppling of one or more of the capacitors 18). In some embodiments, the capacitors may have sufficient support so that such lattice structure may be omitted. In some embodiments, the capacitors may benefit from additional support besides the illustrated single lattice of beam 38, and accordingly additional lattice structures may be provided (as discussed in more detail below with reference to FIG. 21).

Conductive plate material 46 is over the capacitors 18, and is electrically coupled with the second electrodes 26 of the capacitors. In the shown embodiment, the conductive plate material 46 is divided amongst two conductive plates 48. In other embodiments, there may be only a single conductive plate 48, or there may be more than two conductive plates 48 (examples of such other embodiments are described below with reference to FIGS. 7 and 8). If the capacitors 18 comprise only non-ferroelectric insulative material 28 (i.e., are capacitors of a type utilized in conventional DRAM), it may be preferable to have only a single plate 48 extending across all of the capacitors of the array 22. Alternatively, if the capacitors 18 comprise ferroelectric insulative material 28, it may be preferable to have two or more plates 48 associated with the array 22. Each of the plates 48 may be referred to as a common plate (CP). The common plate(s) may be coupled with any suitable voltage, such as, for example, a voltage within a range of from greater than or equal to ground to less than or equal to VCC (i.e., ground≤CP≤VCC). In some applications, a common plate is at a voltage of about one-half VCC (i.e., about VCC/2).

The conductive plate material 46 may comprise any suitable electrically conductive composition, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive plate material 46 may comprise one or more of tungsten, copper, titanium nitride, tungsten silicide, etc. The conductive plate material 46 may be homogenous (as shown), or may comprise two or more discrete compositions.

An insulative structure 52 is over the conductive plates 48. The insulative structure 52 comprises insulative material 50. Such insulative material may comprise any suitable composition or combination of compositions; including, for example, silicon nitride, aluminum oxide, etc. The insulative material 50 may be homogenous (as shown), or may comprise two or more discrete compositions.

The insulative structure 52 has lateral edge regions (i.e., vertical regions) 54 which extend downwardly and surround the capacitors 18 of array 22. Although regions 54 may be referred to as "vertical regions" it is to be understood that such vertical regions may or may not extend orthogonally relative to upper surfaces of underlying materials. Instead, the term "vertical regions" is utilized to indicate that the regions 54 extend downwardly along the edges of the array 22, rather than extending laterally across the array 22.

The capacitors 18 within the array 22 are electrically isolated from one another by void regions 56. Specifically, the void regions 56 are under the insulative beam 38 and between the internal capacitors 32, and also are between the inner edges 31 of the edge capacitors 30 and the internal capacitors 32.

Additional void regions 58 are between the outer edges 33 of the edge capacitors and the lateral edge regions 54 of the insulative structure 52. Such additional void regions 58 are beneath the peripheral extensions 44 of the insulative beam 38.

In some embodiments, the void regions 56 may be referred to as first void regions, and the void regions 58 may be referred to as second void regions.

The void regions 56/58 may be gassed-filled regions, and in such embodiments may contain air, nitrogen, and/or any other suitable gas.

An insulative support structure 62 is under the capacitors 18. The support structure 62 may comprise any suitable insulative material 60; including, for example, one or more of silicon dioxide, silicon nitride, aluminum oxide, etc. The material 60 may be homogenous (as shown), or may comprise two or more discrete compositions.

Transistors 20 are supported within the insulative support structure 62. Each of the transistors 20 comprises a pillar 64 of semiconductor material 66. The semiconductor material 66 may comprise any suitable composition or combination of compositions; including, for example, one or more of silicon, germanium, etc.

The semiconductor material 66 within each of the pillars 64 is appropriately doped to comprise a first source/drain region 68, a second source/drain region 70, and a channel region 72 between the first and second source/drain regions. Dashed-lines are provided within the pillars 64 to diagrammatically illustrate approximate boundaries between the source/drain regions 68/70 and the channel regions 72. Although the source/drain regions are illustrated to be physically distinct structures, in other embodiments the source/drain regions may not be physically distinct.

The first source/drain regions 68 are electrically coupled with the first electrodes 24 of capacitors 18.

Each of the transistors 20 has gate material 74 along the channel region 66, and spaced from the channel region by gate insulator material 76.

The gate material 74 may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The gate material 74 may be homogenous (as shown), or may comprise two or more discrete compositions.

The gate insulator material 76 may comprise any suitable composition or combination of compositions; including, for example, silicon dioxide, aluminum oxide, hafnium oxide, zirconium oxide, ferroelectric material, etc. The gate insulator material 76 may be homogenous (as shown), or may comprise two or more discrete compositions.

The gate material 74 is comprised by wordlines that extend in and out of the page relative to the cross-sectional view of FIG. 1. Such wordlines are schematically illustrated as wordlines WL-1, WL-2, WL-3, WL-4 and WL-5 in the diagram of FIG. 1.

A bitline, BL-1, is under the transistors 20, and is electrically coupled with the second source/drain regions 70 of such transistors. The bitline BL-1 comprises bitline material 78. Such bitline material may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The bitline material 78 may be homogenous (as shown), or may comprise two or more discrete compositions.

The illustrated memory cells 16 are examples of a few of a large plurality of memory cells that may extend across the array 22. For instance, the array 22 may comprise hundreds, thousands. millions etc. of memory cells. The illustrated wordlines (e.g., WL-1, WL-2, WL-3, WL-4 and WL-5) are examples of a large plurality of wordlines that may extend across the array 22, and the illustrated bitline (e.g., BL-1) is an example bitline of a large plurality of bitlines that may extend across the array 22. The wordlines may extend along rows of the array 22, and the bitlines may extend along columns of the array 22. The wordlines and bitlines extend linearly and may be straight in some applications; or curvy, wavy, etc. in other applications. The wordlines and bitlines cross one another; and in some embodiments the bitlines may extend substantially orthogonally relative to the wordlines. Each memory cell 16 may be uniquely addressed through the combination of a wordline and a bitline.

The bitlines (e.g., BL-1) and the capacitors and wordlines thereover may be considered to be comprised by a deck 80. In the illustrated embodiment, the periphery 14 is comprised by a base 82 that supports the deck 80. Such base 82 may comprise semiconductor material; and may, for example, comprise monocrystalline silicon. The base 82 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 82 may correspond to a semiconductor substrate containing one or more materials associated with integrated circuit fabrication. Such materials may include, for example, one or more of refractory metal materials, barrier materials, diffusion materials, insulator materials, etc. For instance, in the illustrated embodiment the base 82 comprises the peripheral region 14 having circuitry 84 utilized for driving the wordlines (e.g., WL-1, WL-2, WL-3, WL-4 and WL-5), and circuitry 86 utilized for driving the bitlines (e.g., BL-1). The circuitries 84 and 86 may comprise, for example, CMOS and/or any other suitable circuitry. The circuitries 84 and 86 may be laterally spaced from one another (as shown) or may overlap.

The configuration of FIG. 1 shows the internal capacitors 32 laterally surrounded by the first void regions 56, and shows the edge capacitors 30 laterally surrounded by combinations of first void regions 56 and second void regions 58. The environment around a capacitor may influence electrical properties of the capacitor. Accordingly, if the second void regions 58 are sufficiently similar to the first void regions 56, the edge capacitors 30 may have electrical properties similar to, or even identical to, the internal capacitors 32. In such embodiments, the edge capacitors 30 and internal capacitors 32 may all be incorporated into functioning memory cells 16 of integrated memory. Alternatively, if the void regions 58 are substantially different from the void regions 56, or missing altogether, the edge capacitors 30 may have dissimilar electrical properties relative to the internal capacitors 32. In such applications, problematic edge capacitors may be incorporated into dummy structures rather than being comprised by functioning memory cells of integrated memory. The dummy structures are structurally similar to the memory cells 16, but are functionally different. Specifically, the dummy structures operate simply as placeholders along the edge of the array 22 and are not programmed, addressed, or otherwise utilized in functioning memory cells.

Figure 3:
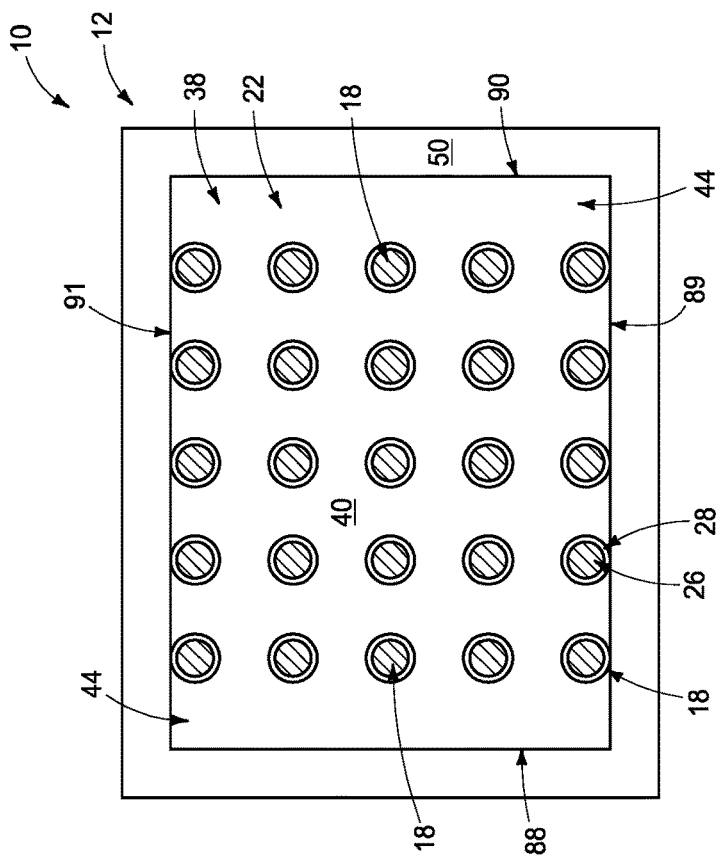
FIGS. 2 and 3 are top-down views of portions of example memory arrays, with the views of FIGS. 2 and 3 being generally downward along a direction indicated by the line A-A in FIG. 1.
Figure 2:
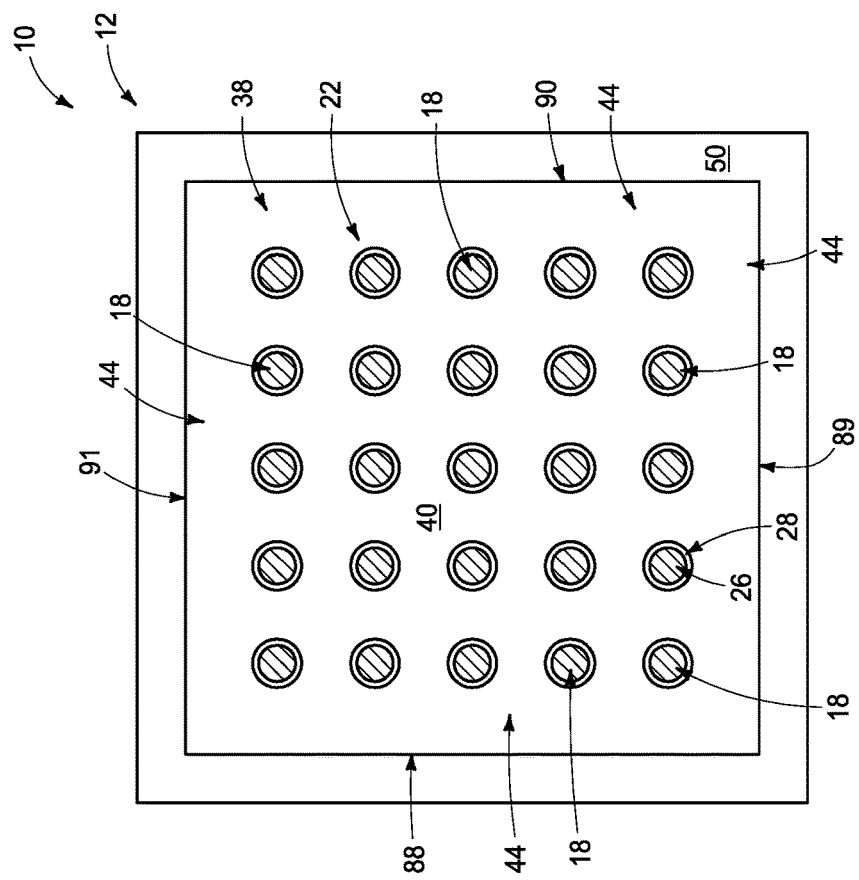

The configuration of the peripheral extensions 44 of the beam 38 may influence characteristics of the second void regions 58, and accordingly may determine if one or more of the edge capacitors 30 is utilized as a dummy structure rather than being incorporated into a functioning memory cell. FIGS. 2 and 3 show top-down views along a direction indicated by the line A-A of FIG. 1, and show example arrays 22 of capacitors 18 (only some of the capacitors 18 are labeled in each of the views of FIGS. 2 and 3 to simplify the drawings). The views of FIGS. 2 and 3 are not to the same scale as the view of FIG. 1. The arrays 22 of FIGS. 2 and 3 comprise 25 capacitors. In actual practice, the arrays may comprise many more capacitors (for instance, hundreds, thousands, millions, tens of millions, etc.), but only 25 capacitors are illustrated in order to simplify the drawings.

Each of the arrays of FIGS. 2 and 3 is square-shaped, and has edges 88-91.

The embodiment of FIG. 2 has beam 38 (material 40) extending outwardly beyond the array 22 along all of the edges 88-91, and accordingly the peripheral extensions 44 extend outwardly beyond all of the edge capacitors. Thus, void regions 58 (FIG. 1) may be provided outwardly of all of the edge capacitors, and in some embodiments all of the edge capacitors may be incorporated into functioning memory cells 16 (FIG. 1).

In contrast, the embodiment of FIG. 3 has beam 38 (material 40) extending outwardly beyond the array 22 only along the edges 88 and 90, and not along the edges 89 and 91. Thus, the peripheral extensions 44 extend outwardly past the edge capacitors along the edges 88 and 90, but do not extend outwardly beyond the edge capacitors along the edges 89 and 91. Accordingly, void regions 58 (FIG. 1) may be provided outwardly of the edge capacitors along edges 88 and 90, but are not provided outwardly of the edge capacitors along the edges 89 and 91. This may cause the edge capacitors along the edges 89 and 90 to have different electrical properties as compared to other capacitors within the array 22, and it may be advantageous to effectively "quarantine" such edge capacitors by incorporating them into dummy structures rather than into functioning memory cells.

Referring again to FIG. 1, the memory cells 16 and transistors 20 of the memory array 22 may be utilized in various arrangements XTYC, where X and Y are integers, T is transistor and C is capacitor. Such arrangements may include, for example, 1T1C, 2T1C and 2T2C; any which may be utilized with either ferroelectric memory or non-ferroelectric memory. Example 1T1C, 2T1C and 2T2C configurations are described with reference to FIGS. 4-6.

Figure 4:
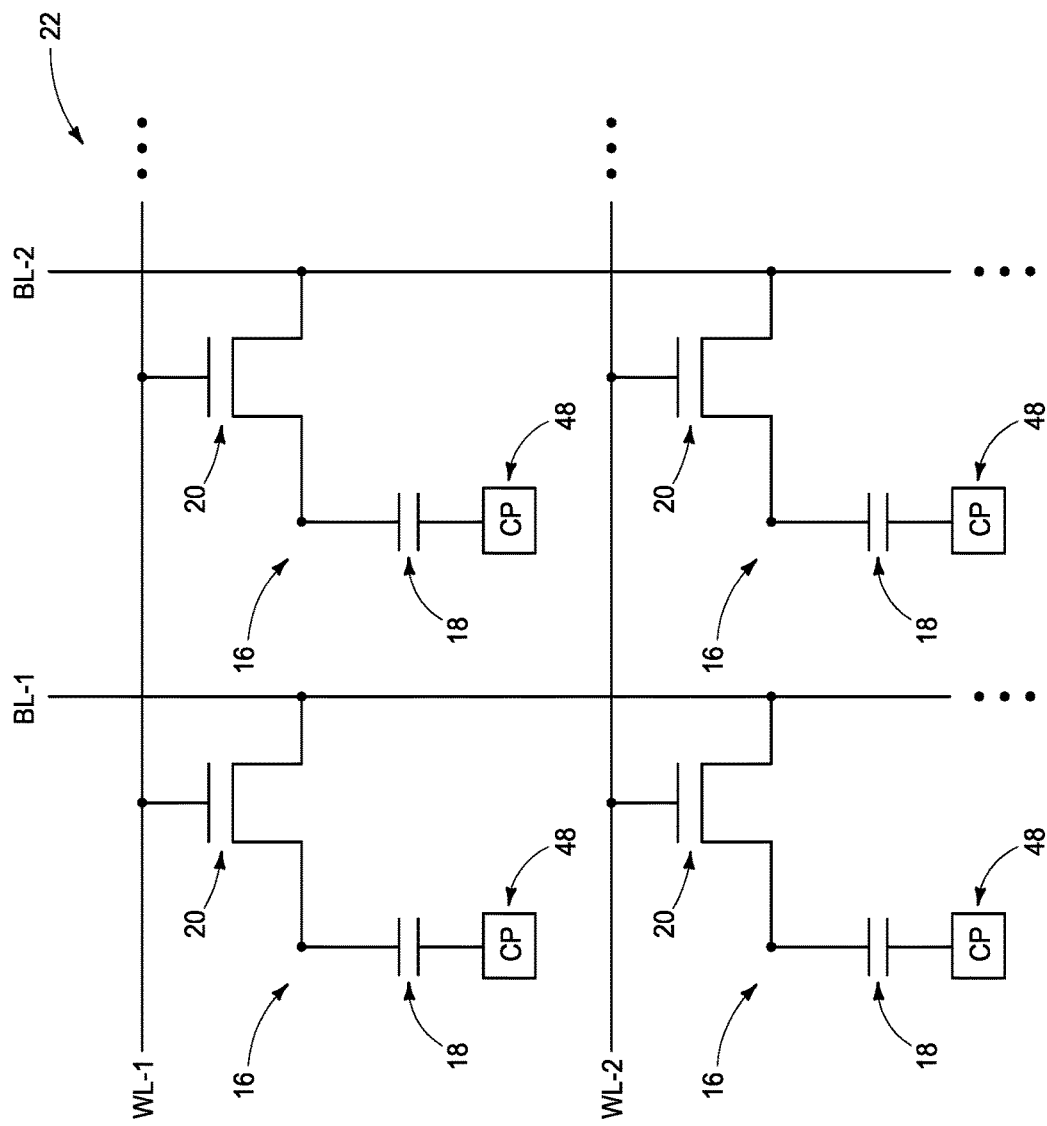
FIGS. 4-6 are diagrammatic schematic diagrams of example memory cell arrangements; with FIG. 4 showing a 1T1C arrangement, FIG. 5 showing a 2T1C arrangement, and FIG. 6 showing a 2T2C arrangement.

Referring to FIG. 4, an array 22 is shown comprising memory cells in the 1T1C configuration. Specifically, each memory cell 16 comprises a transistor 20 in combination with a capacitor 18. The illustrated region of the array 22 comprises wordlines WL-1 and WL-2, and comprises bitlines BL-1 and BL-2. Each memory cell 16 is uniquely addressed by the combination of a wordline and a bitline.

Figure 5:
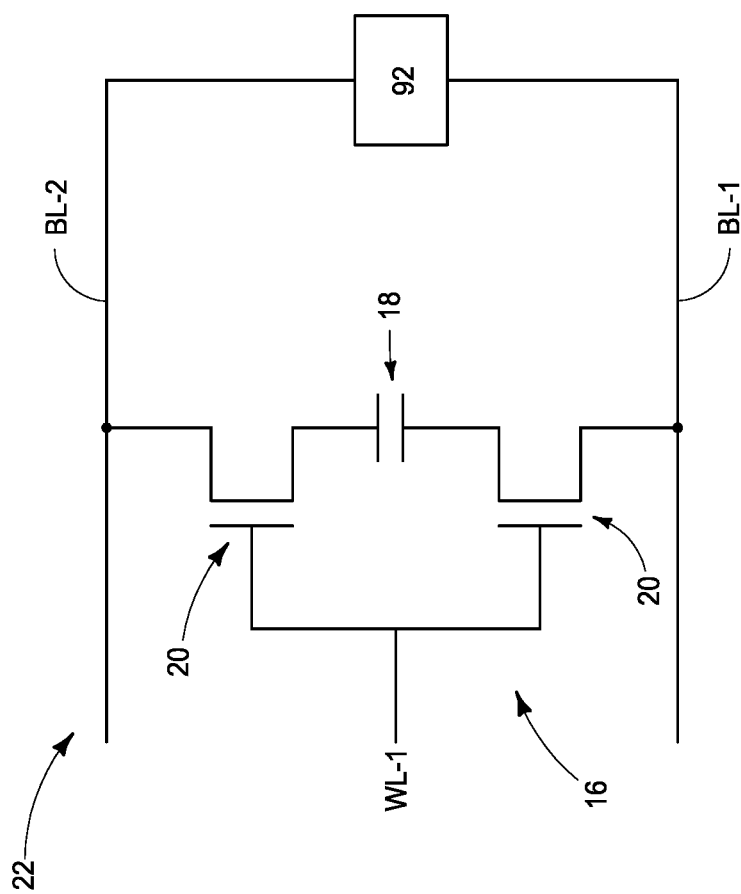

Referring to FIG. 5, an array 22 is shown comprising a memory cell in the 2T1C configuration. Specifically, the memory cell 16 comprises two transistors 20 in combination with a single capacitor 18. The illustrated region of the array 22 comprises wordline WL-1, and comprises bitlines BL-1 and BL-2. The bitlines BL-1 and BL-2 may be referred to as comparative bitlines, in that electrical properties (e.g., voltage) of the two are compared (utilizing circuitry 92) to ascertain a memory state of memory cell 16.

Figure 6:
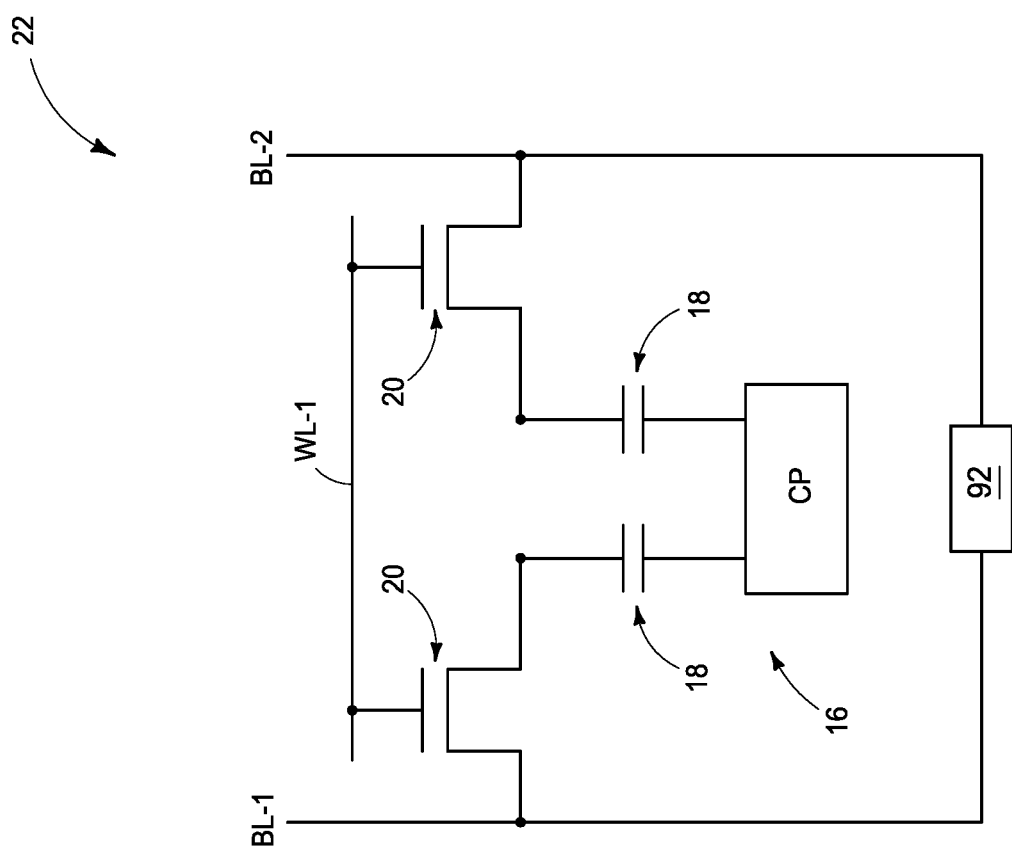

Referring to FIG. 6, an array 22 is shown comprising a memory cell in the 2T2C configuration. Specifically, the memory cell 16 comprises two transistors 20 in combination with two capacitors 18. The illustrated region of the array 22 comprises wordline WL-1, and comprises bitlines BL-1 and BL-2. The bitlines BL-1 and BL-2 may be comparative bitlines similar to those described above with reference to FIG. 5.

Figure 8:
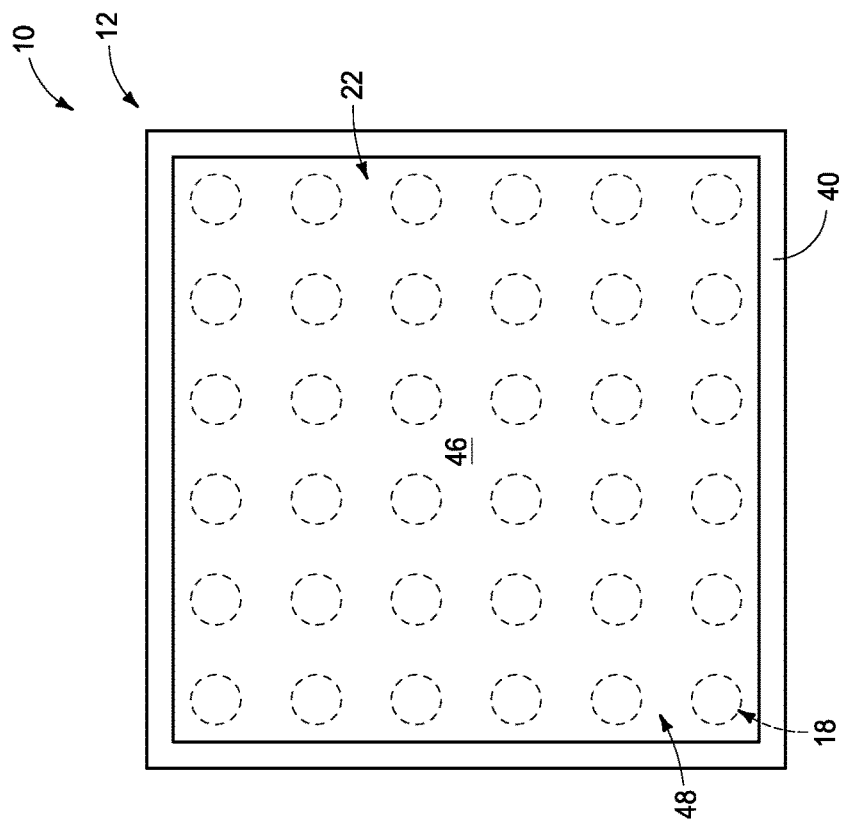
FIGS. 7 and 8 are top-down views of portions of example memory arrays, with the views of FIGS. 7 and 8 being generally downward along a direction indicated by the line B-B in FIG. 1.
Figure 7:
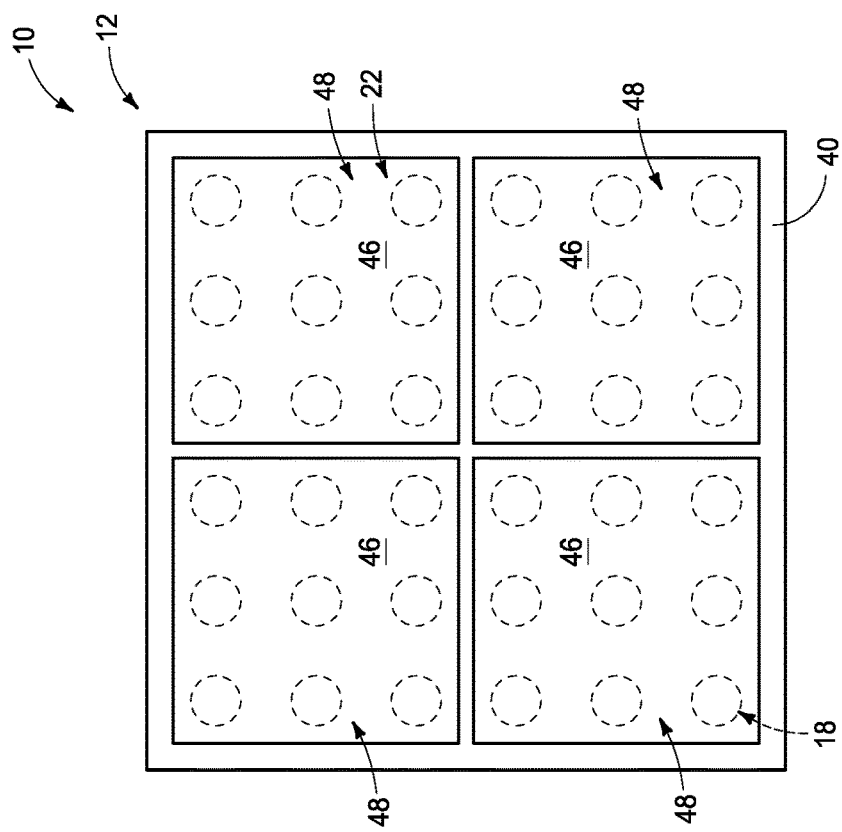

Referring again to FIG. 1, the conductive plate material 46 may be provided as a single conductive plate 48, or as multiple conductive plates. FIGS. 7 and 8 show top-down views along a direction indicated by the line B-B of FIG. 1, and show example arrays 22 of capacitors 18 (the capacitors 18 are shown in dashed-line view to indicate that they are below the planes of the cross-sections of FIGS. 7 and 8). The views of FIGS. 7 and 8 are not to the same scale as the view of FIG. 1.

FIG. 7 shows the conductive plate material 46 subdivided amongst four different conductive plates 48 across the array 22, and FIG. 8 shows the conductive plate material 46 as a single conductive plate extending across an entirety of the array 22.

Any suitable number of conductive plates 48 may be utilized across the array 22. The appropriate number of conductive plates 48 may depend in part on the capacitance and configuration of capacitors 18. For instance, it may be advantageous to utilize only a single conductive plate 48 extending across all of the capacitors 18 of non-ferroelectric memory, and it may be advantageous to utilize multiple different conductive plates 48 extending across an array of ferroelectric memory. If multiple different conductive plates 48 are utilized, the conductive plates may be all the same size and shape as one another (as shown in FIG. 7), or in other embodiments at least one of the conductive plates 48 may be of a different size and/or shape as compared to at least one other of the conductive plates 48.

Figure 9:
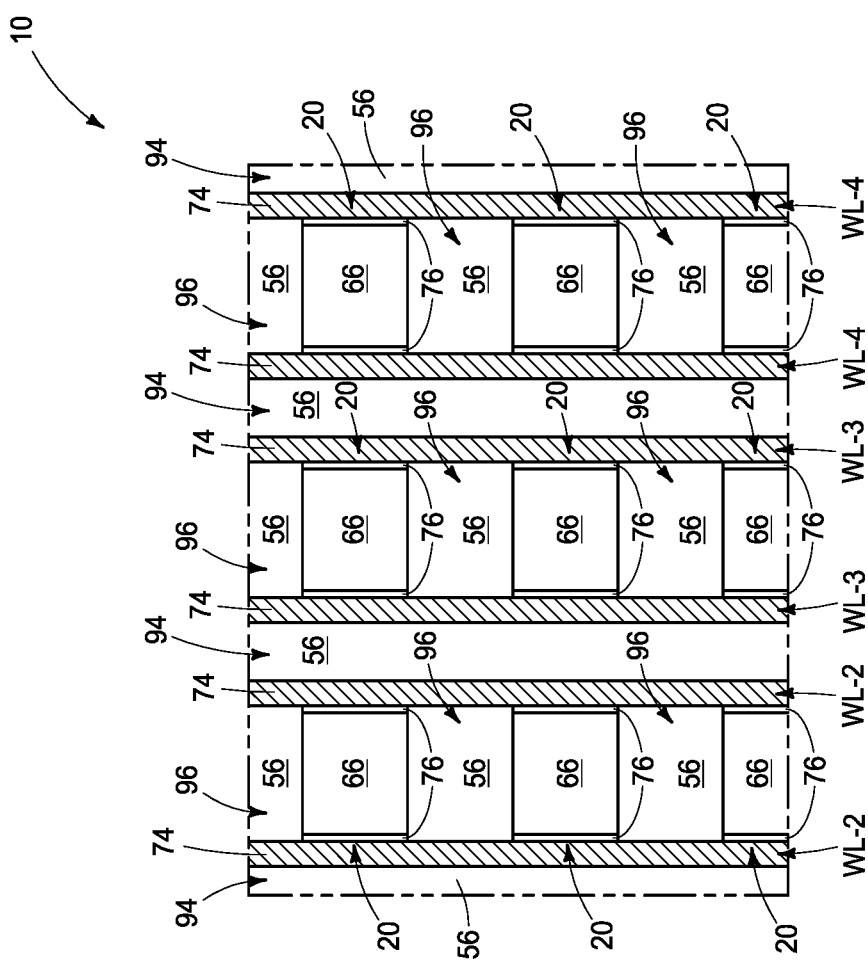
FIG. 9 is top-down view of an example wordline arrangement, with the view of FIG. 9 being generally downward along a direction indicated by the line C-C in FIG. 1.
Figure 10:
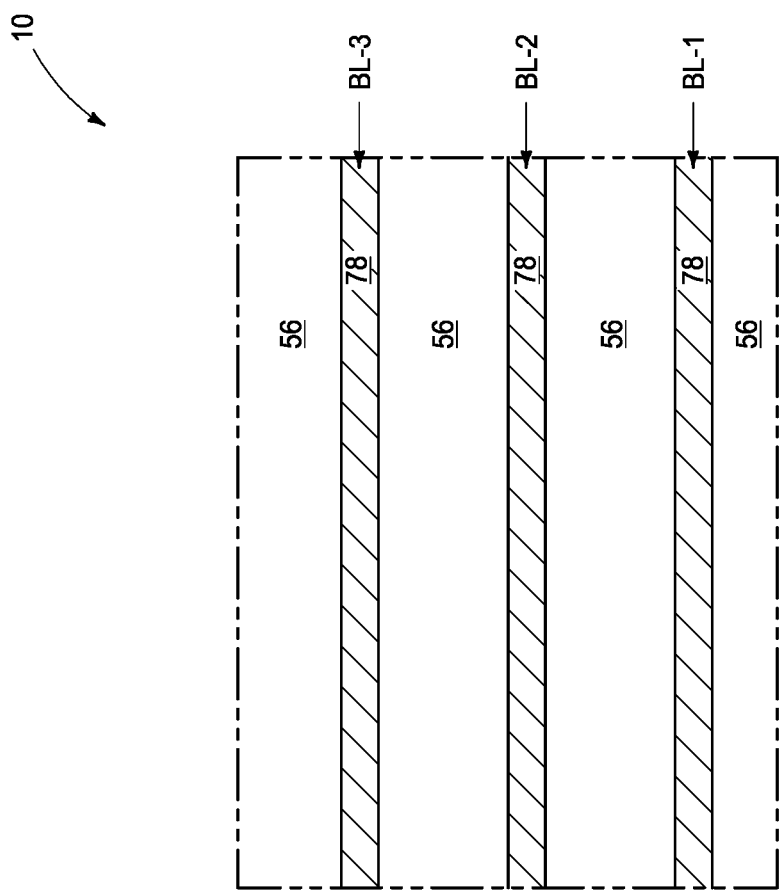
FIG. 10 is top-down view of an example bitline arrangement, with the view of FIG. 10 being generally downward along a direction indicated by the line D-D in FIG. 1.

Referring again to FIG. 1, the first and second void 56 and 58 are shown extending along lower regions 36 of the capacitors 18, and stopping on the insulative material 60 that extends between the transistors 20. In other embodiments, the first void regions 56 (and possibly also the second void regions 58) may extend downwardly to between the transistors 20, and possibly may also extend downwardly to between the bitlines (e.g., BL-1) beneath transistors 20. For instance, FIGS. 9 and 10 show top-down views along directions indicated by the lines C-C and D-D of FIG. 1, respectively, and show void regions extending downwardly to between wordlines and bitlines. The views of FIGS. 9 and 10 are not to the same scale as the view of FIG. 1.

Referring to FIG. 9, the void regions 56 are shown extending downwardly to be in regions 94 between adjacent rows (i.e., to be between the wordlines (e.g., WL-2, WL-3 and WL-4)), and also to be in regions 96 along the rows. In some embodiments, solid or semisolid insulative material (for instance, silicon nitride, silicon dioxide, etc.) may be within the regions 96 along the rows, and the void regions 56 may be within the regions 94 between the rows; or the solid/semisolid insulative material may be within the regions 94 and the void regions may be within the regions 96.

Referring to FIG. 10, the void regions 56 are shown extending downwardly to be between bitlines (e.g., BL-1, BL-2 and BL-3).

It may be advantageous in some embodiments for the void regions 56 (and/or 58) to extend downwardly between the wordlines (as shown in FIG. 9) in that such may reduce capacitive coupling between adjacent wordlines as compared to utilization of solid or semisolid insulative material. Similarly, in some embodiments it may be advantageous for the void regions 56 (and/or 58) to extend downwardly between the bitlines (as shown in FIG. 10).

In some embodiments, multiple memory array decks (e.g., the deck 80 of FIG. 1) may be stacked one atop another in an integrated structure. At least one of the decks may differ relative to another of the decks in the memory cell arrangement of transistors and capacitors (e.g., one of the decks may have memory cells in a 1T1C arrangement, while another of the decks has memory cells in either a 2T1C arrangement or a 2T2C arrangement), and/or at least one of the decks may comprise ferroelectric memory while another comprises non-ferroelectric memory. In some embodiments, at least some of the decks may comprise a same memory cell arrangement of transistors and capacitors as one another, and in some embodiments all of the decks may comprise a same memory cell arrangement of transistors and capacitors as one another. Example embodiments of stacked memory deck arrangements are described with reference to FIGS. 11-14.

Figure 11:
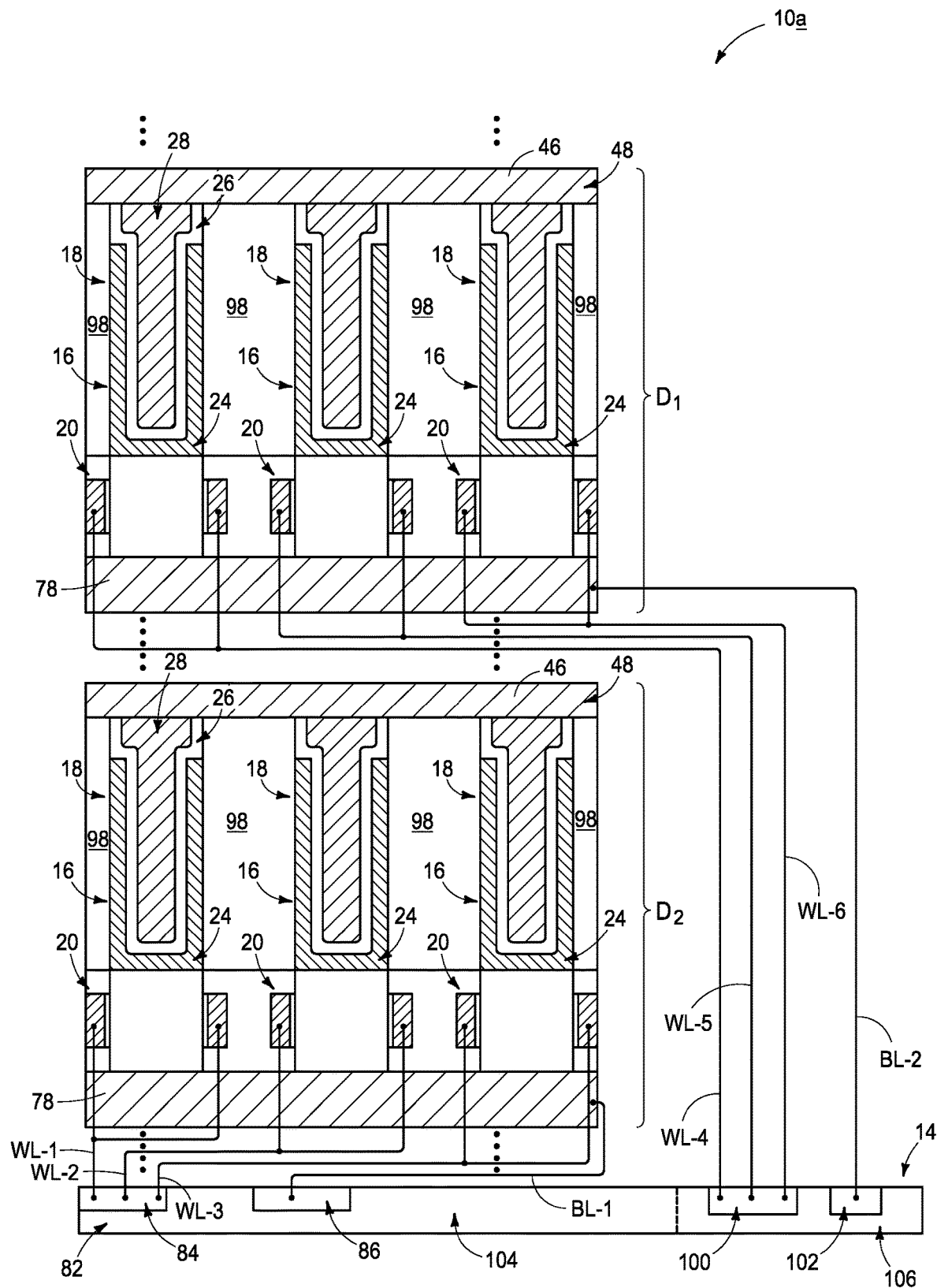
FIGS. 11-14 are diagrammatic cross-sectional side views of example arrangements of memory array decks in integrated structures.

Referring to FIG. 11, a construction 10a includes a first deck $D_1$ over a second stack $D_2$, which in turn is over a peripheral region 14 associated with a base 82. Each of the decks $D_1$ and $D_2$ comprises memory cells 16 having capacitors 18 and transistors 20 of the type described above with reference to FIG. 1. Each of the decks $D_1$ and $D_2$ also comprises conductive plate material 46, and comprises bitline material 78.

In the illustrated embodiment, the capacitors 18 are spaced from one another by solid and/or semisolid insulative material 98 (e.g., silicon dioxide, silicon nitride, etc.), and the supporting lattice of FIG. 1 (insulative beam 38) is not shown. In other embodiments, at least one of the decks $D_1$ and $D_2$ may comprise the insulative beam 38, and may comprise void regions between the capacitors 18, and possibly also between wordlines beneath the capacitors, and possibly also between bitlines beneath the wordlines. In other words, at least one of the decks $D_1/D_2$ may have a configuration analogous to that described with reference to FIG. 1 relative to the deck 80.

The lower deck $D_2$ comprises wordlines (e.g., WL-1, WL-2 and WL-3) which extend to circuitry 84 associated with peripheral region 14, and comprises bitlines (e.g., BL-1) which extend to circuitry 86 associated with the peripheral region 14. The upper deck $D_1$ comprises wordlines (e.g., WL-4, WL-5 and WL-6) which extend to circuitry 100 associated with peripheral region 14, and comprises bitlines (e.g., BL-2) which extend to circuitry 102 associated with the peripheral region 14.

The illustrated memory array decks $D_1$ and $D_2$ may be part of an arrangement comprising multiple additional memory array decks over the upper deck $D_1$.

In some embodiments, the peripheral region may be subdivided into multiple segments (e.g., segments 104, 106, etc.), with each segment having circuitry configured for addressing individual memory array decks. For instance, one of the decks D1/D2 may comprise ferroelectric memory, while the other of the decks D1/D2 comprises non-ferroelectric memory; and one of the illustrated regions 104/106 may comprise circuitry suitable for utilization with the ferroelectric memory (e.g., memory in which capacitor insulative material 28 comprises at least one ferroelectric material) while the other of the regions 104/106 comprises circuitry suitable for utilization with the non-ferroelectric memory (e.g., memory in which the capacitor insulative material 28 comprises only non-ferroelectric material). In some embodiments, the ferroelectric memory may be associated with the upper deck D1 while the non-ferroelectric memory is associated with the lower deck D2; and in other embodiments the non-ferroelectric memory may be associated with the upper deck D1 while the ferroelectric memory is associated with the lower deck D2.

As another example, one of the decks D1/D2 may comprise memory cells in a 1T1C arrangement, while the other of the decks D1/D2 comprises memory cells in a different arrangement (e.g., 2T1C, 2T2C, etc.), and one of the illustrated regions 104/106 may comprise circuitry suitable for utilization with the 1T1C arrangement while the other of the regions 104/06 comprises circuitry suitable for utilization with the other arrangement. In such embodiments, one of the decks D1/D2 may be referred to as comprising first transistors electrically coupled with first capacitors in a first arrangement XTYC (where X and Y are integers, T is transistor and C is capacitor), and the other of the decks D1/D2 may be referred to as comprising second transistors electrically coupled with second capacitors in a second arrangement PTQC (where P and Q are integers, T is transistor and C is capacitor); with the second arrangement comprising a different number of transistors as compared to the first arrangement (i.e., where X is different than P), and/or with the second arrangement comprising a different number of capacitors as compared to the first arrangement (i.e., where Y is different than Q). In some embodiments, the arrangements XTYC and PTQC are arrangements selected from the group consisting of 1T1C, 2T1C and 2T2C.

Figure 12:
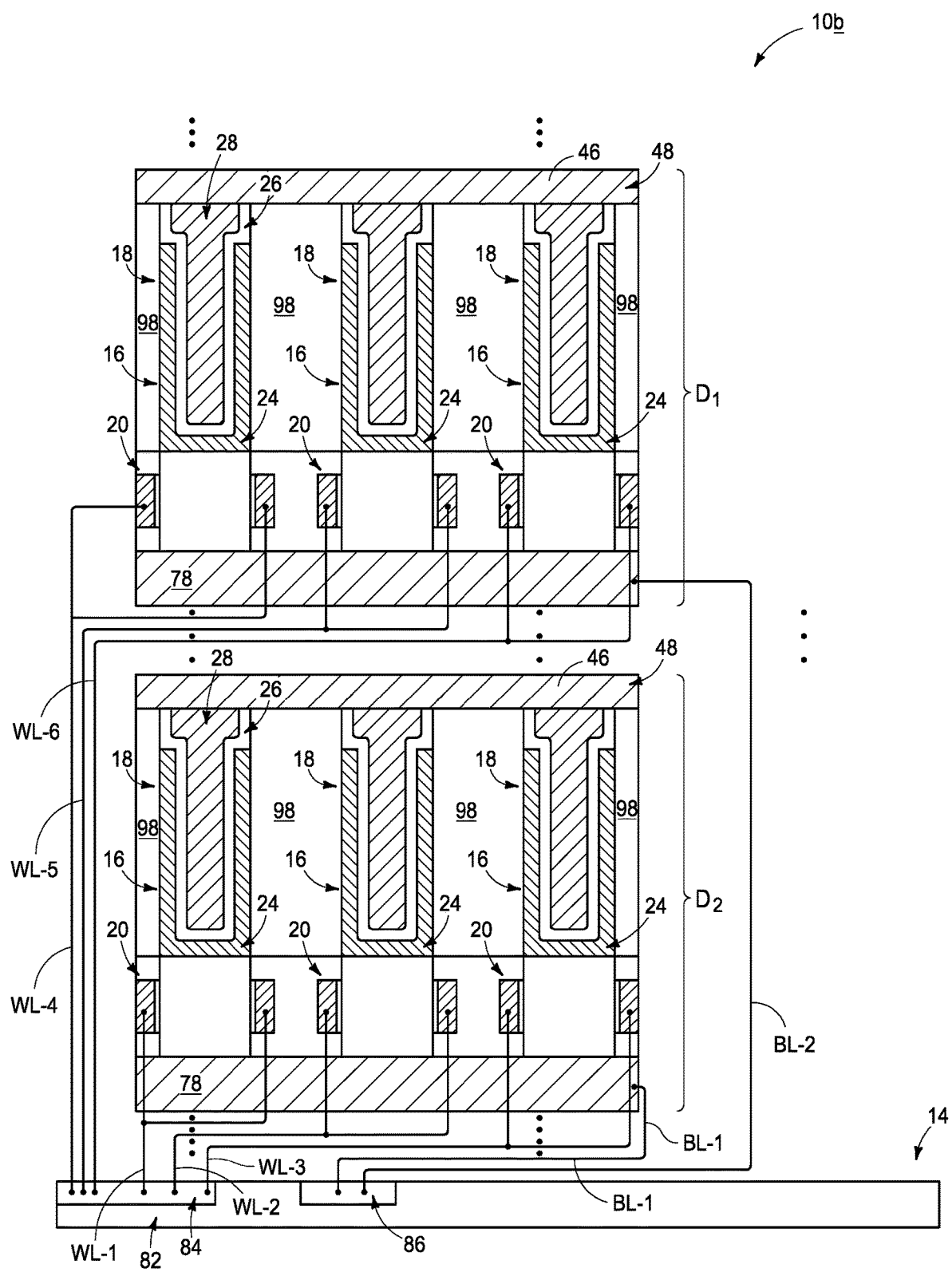

Although the embodiment of FIG. 11 shows wordlines and bitlines from the upper deck $D_1$ extending to a different segment (104 or 106) of the peripheral region 14 than the wordlines and bitlines from the lower deck $D_2$, in other embodiments the wordlines and bitlines from both of the decks $D_1$ and $D_2$ may extend to common circuitry associated with the peripheral region, as shown in a construction 10b of FIG. 12.

Figure 13:
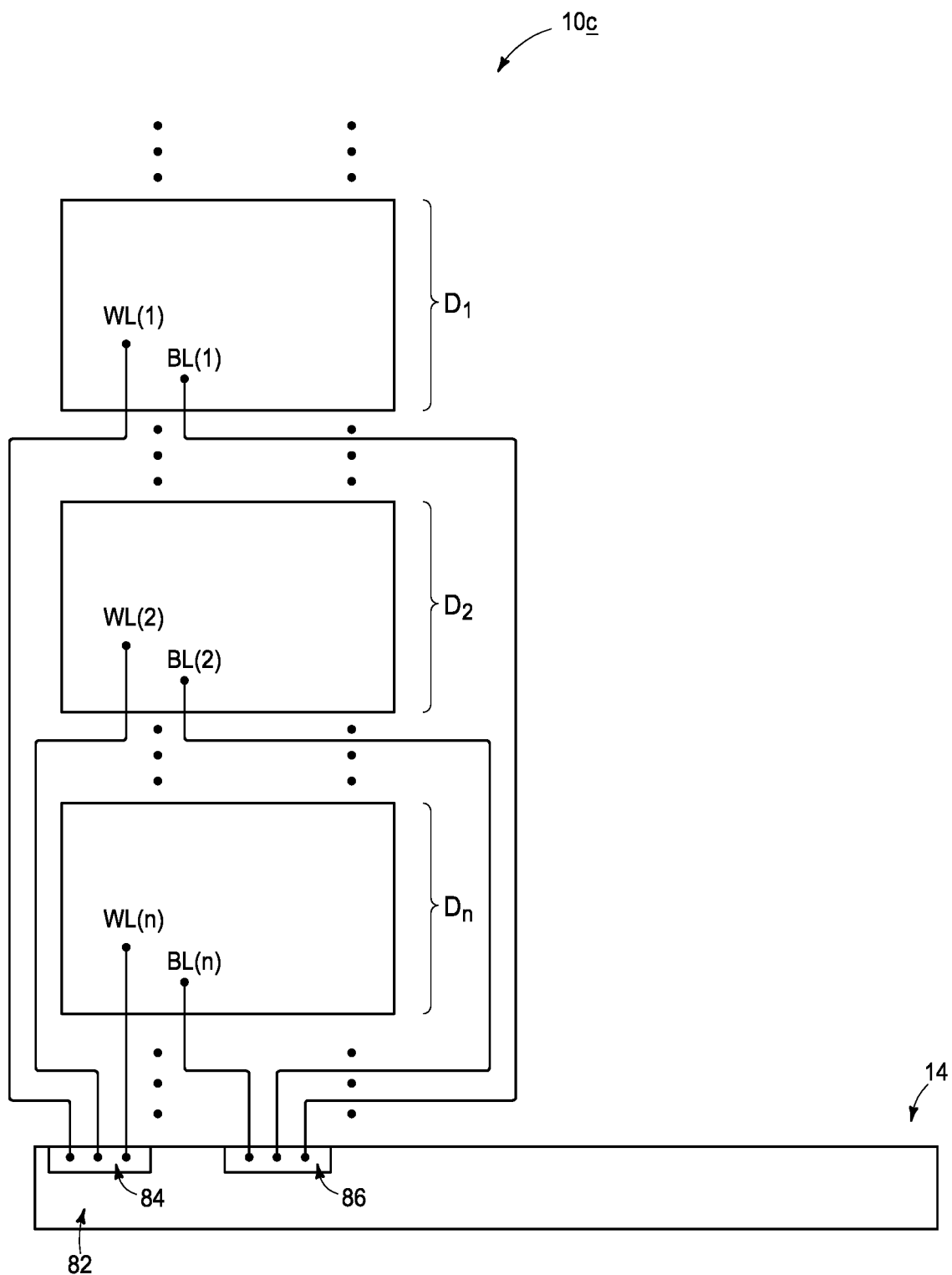

FIG. 13 shows a construction 10c which schematically illustrates an embodiment in which multiple memory decks $D_{1-n}$ are stacked over a peripheral region 14 associated with a base 82, and in which each of the decks has wordlines (WL(1-$n$)) and bitlines (BL(1-$n$)) extending to common circuitry 84/86 associated with the peripheral region 14. Any of the decks may have a configuration analogous to that of deck 80 in FIG. 1, and accordingly may have void regions 56/58 extending between capacitors, and possibly extending to between wordlines beneath the capacitors, and possibly also extending to between bitlines beneath the wordlines. The decks $D_{1-n}$ may comprise ferroelectric memory or non-ferroelectric memory.

In some embodiments, one or more of decks $D_{1-n}$ may differ relative to another of the decks in having a different configuration of void regions 56/58 (FIG. 1). For instance, one of the decks may have void regions 56/58 while another of the decks lacks such void regions; one of the decks may have void regions 56/58 extending downwardly to between wordlines, while the other of the decks does not have void regions extending downwardly to between wordlines; one of the decks may have void regions 56/58 extending downwardly to between bitlines, while the other of the decks does not have void regions extending downwardly to between the bitlines, etc.

Figure 14:
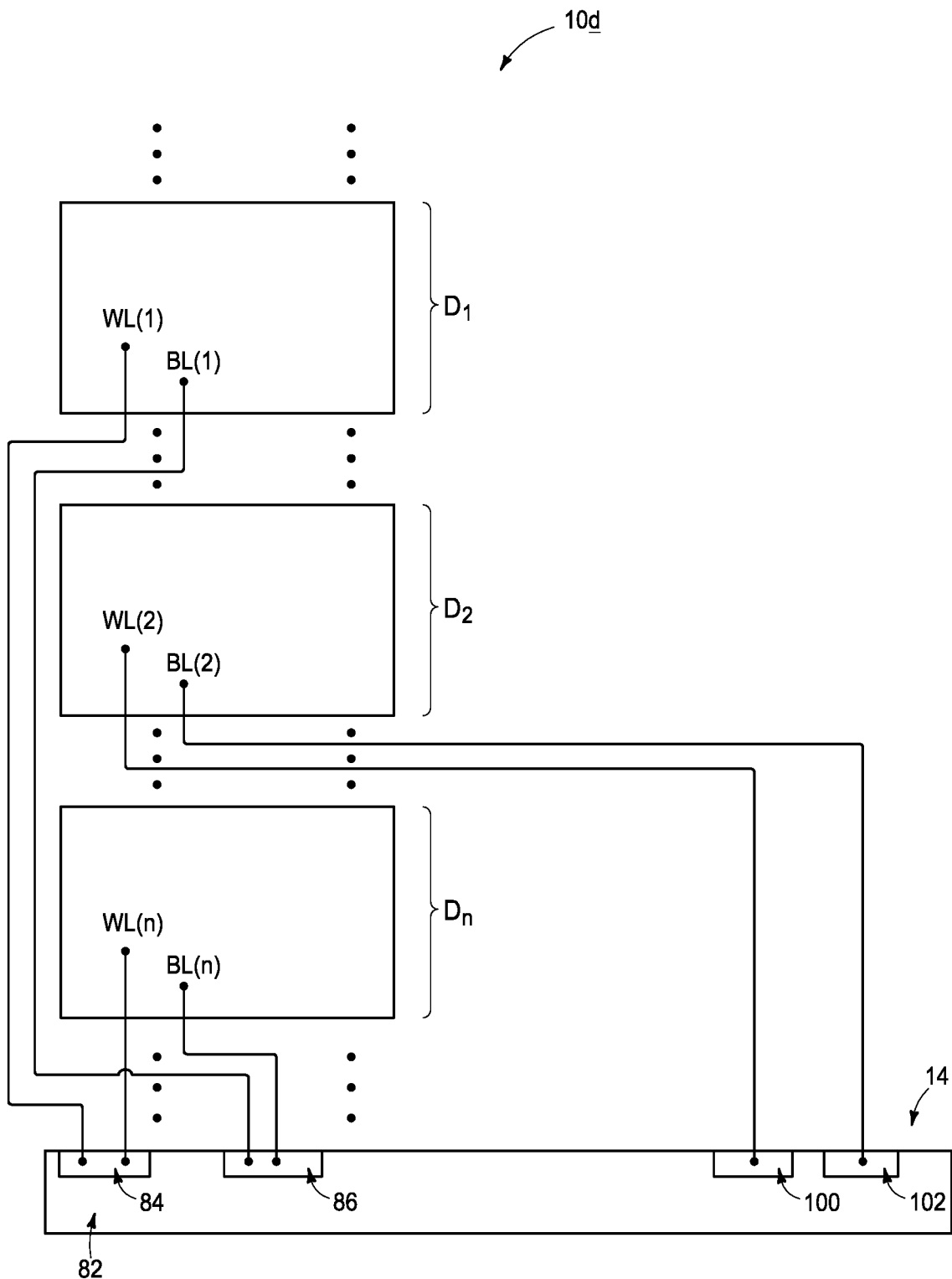

FIG. 14 shows a construction 10d which schematically illustrates an embodiment in which multiple memory decks $D_{1-n}$ are stacked over a peripheral region 14 associated with a base 82, and in which some of the decks have wordlines (WL(1-$n$)) and bitlines (BL(1-$n$)) extending to common circuitry 84/86 associated with the peripheral region 14, while at least one other of the decks has wordlines (WL(1-$n$)) and bitlines (BL(1-$n$)) extending to different circuitry 100/102 associated with the peripheral region 14. Any of the decks may have a configuration analogous to that of deck 80 in FIG. 1, and accordingly may have void regions 56/58 extending between capacitors, and possibly extending to between wordlines beneath the capacitors, and possibly also extending to between bitlines beneath the wordlines. The decks $D_{1-n}$ may comprise ferroelectric memory or non-ferroelectric memory.

In some embodiments, one or more of decks $D_{1-n}$ of FIG. 14 may differ relative to another of the decks in having a different configuration of void regions 56/58 (FIG. 1). In some embodiments, the deck having wordlines and bitlines extending to the different circuitry 100/102 (deck $D_2$) may differ from the other decks in the type of memory (for instance, deck $D_2$ may comprise ferroelectric memory while the other decks comprise non-ferroelectric memory, or vice versa). In some embodiments, the deck having wordlines and bitlines extending to the different circuitry 100/102 (deck $D_2$) may differ from the other decks in the arrangement of transistors and capacitors (for instance, deck $D_2$ may comprise a XTYC arrangement while the other decks comprise PTQC arrangements, where P, Q, X and Y are integers, T is transistor and C is capacitor; and where X is different than P and/or where Y is different than Q).

The various structures described herein may be formed utilizing any suitable methodology. FIGS. 15-18 describe example methods which may be utilized to form the configuration of FIG. 1.

Figure 15:
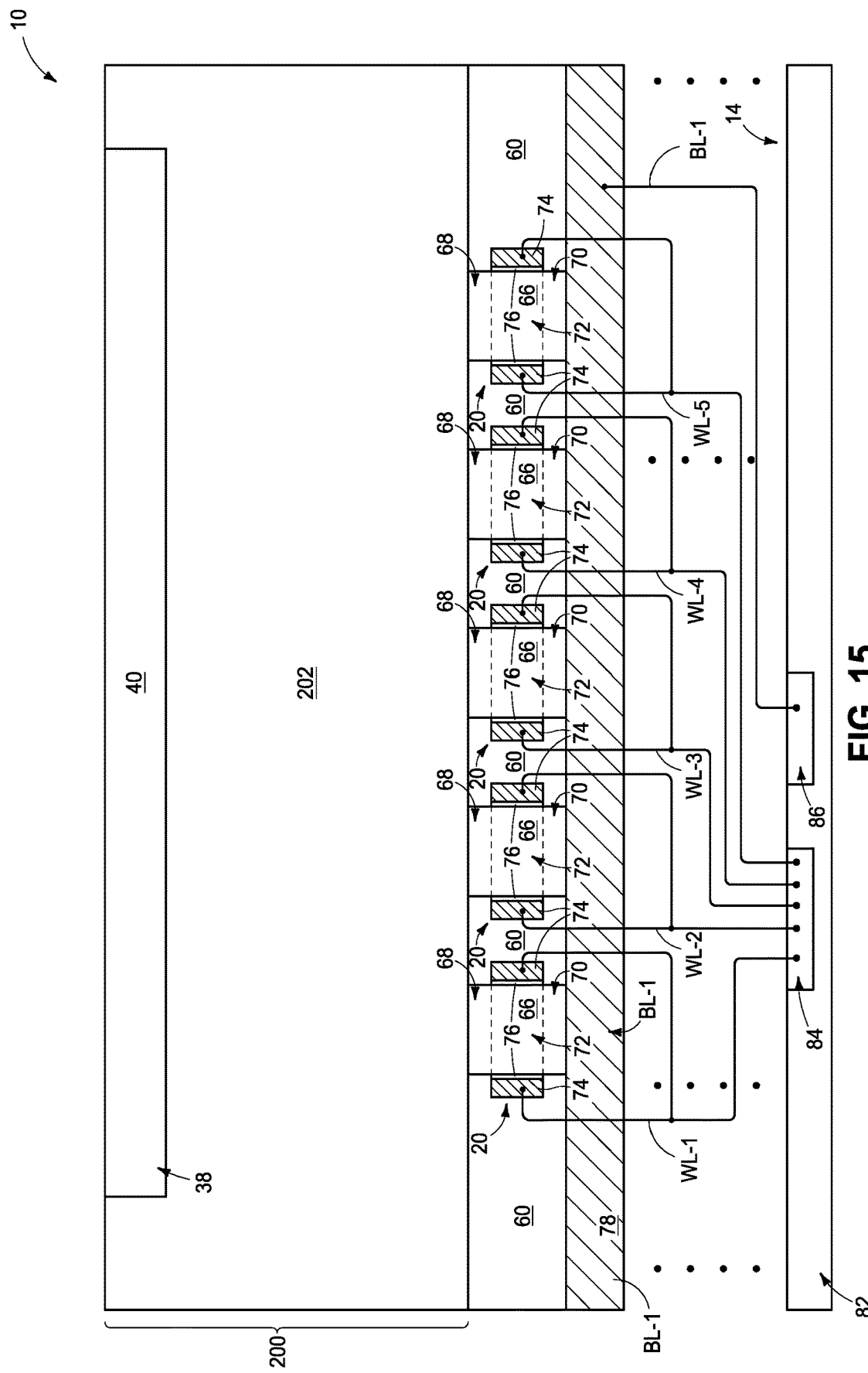
FIGS. 15-18 are diagrammatic cross-sectional side views of an example integrated structure at process stages of an example method.

Referring to FIG. 15, construction 10 is shown comprising a matrix 200 over the transistors 20 and the supporting material 60 between the transistors. The matrix 200 includes the insulative material 40 of insulative beam 38, and includes sacrificial material 202 beneath the insulative material 40. In some embodiments, the support material 60 may be replaced with sacrificial material 202; and in some embodiments the sacrificial material 202 may also extend down to beneath the transistors 20 and between the bitlines (e.g., BL-1).

The sacrificial material 202 may comprise any suitable composition or combination of compositions; and in some embodiments may comprise borophosphosilicate glass. In some example embodiments, the insulative material 40 of beam 38 may consist essentially of, or consist of silicon nitride, and the sacrificial material 202 may consist essentially of, or consist of borophosphosilicate glass. The sacrificial material 202 may then be readily removed selectively relative to the silicon nitride of beam 38 utilizing, for example, a wet etch comprising hydrofluoric acid. In some embodiments, the insulative support material 60 may comprise silicon nitride and/or another composition resistant to an etch utilized to remove sacrificial material 202; and in other embodiments the insulative support material 60 may comprise one or more compositions which are removed with the etch utilized to remove sacrificial material 202.

Figure 16:
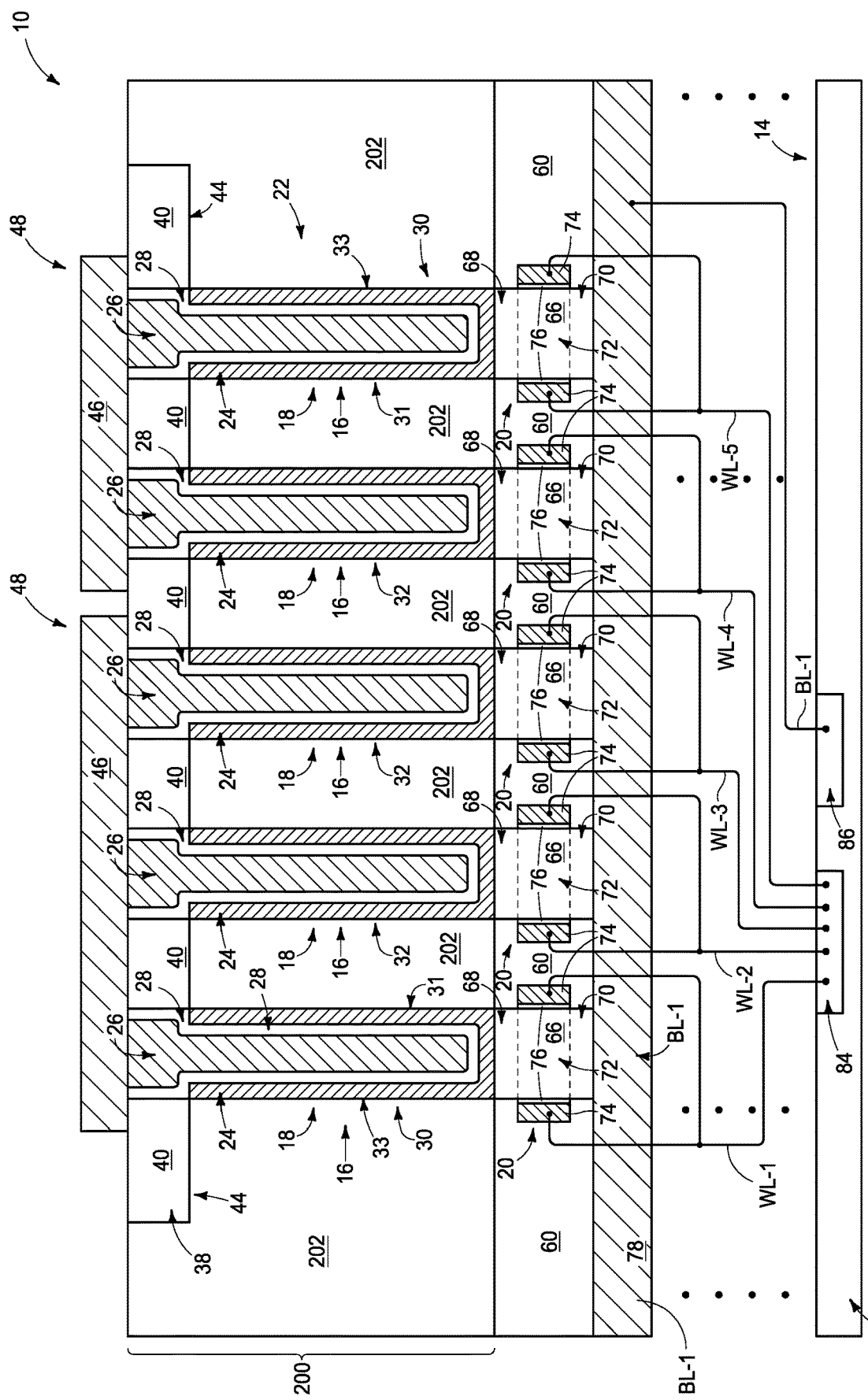

Referring to FIG. 16, the capacitors 18 are formed to extend through the matrix 200, with the capacitors being distributed within the array 22. The capacitors 18 can be formed by etching openings through the matrix 200 utilizing a patterned mask to define locations of the openings (for instance, a patterned photoresist mask, which is not shown); removing the mask, and then depositing suitable materials within the openings to form the electrodes 24/26 and the capacitor insulative material 28. The depositions of the materials of capacitors 18 may utilize any suitable chemistries and methodology; and in some embodiments may utilize one or more of atomic layer deposition (ALD), chemical vapor deposition (CVD), physical vapor deposition (PVD), etc. The specific deposition techniques utilized to form materials of the capacitors 18 may include multiple steps. For instance, the first electrode 24 may be formed and then etched back so that the upper surface of the first electrode is recessed within the openings (and in the shown embodiment is recessed to a level at or below a bottom level of insulative material 40). Subsequently, capacitor insulative material 28 may be formed within an upwardly-opening container defined by the first electrode 24; with the capacitor insulative material 28 forming another upwardly-opening container. Then, the second electrode 26 may be formed to fill the upwardly-opening container of capacitor insulative material 28.

The conductive plate material 46 is formed over insulative material 40 and across upper surfaces of capacitors 18 to be electrically coupled with the second electrodes 26. In the illustrated embodiment, the capacitor plate material 46 is patterned into two capacitor plates 48 along the cross-section section of FIG. 16. In other embodiments, the capacitor plate material 46 may be patterned into only a single conductive plate 48 that extends across the entirety of the array 22, or may be patterned into more than two conductive plates 48.

The capacitors 18 and transistors 20 together form the array of memory cells 16.

Two of the capacitors 18 are edge capacitors 30 analogous to those described above with reference to FIG. 1, and the remaining capacitors 18 are internal capacitors 32. The edge capacitors have inner surfaces (i.e., inner edges) 31 facing the internal capacitors 32, and have outer surfaces (i.e., outer edges) 33 in opposing relation to the inner surfaces 31.

The insulative beam 38 extends laterally between the capacitors 30/32, and has peripheral extensions 44 that extend laterally outwardly beyond the edge capacitors 30.

The matrix 200 having the capacitors 30/32 therein may be referred to as an assembly in some embodiments.

Figure 17:
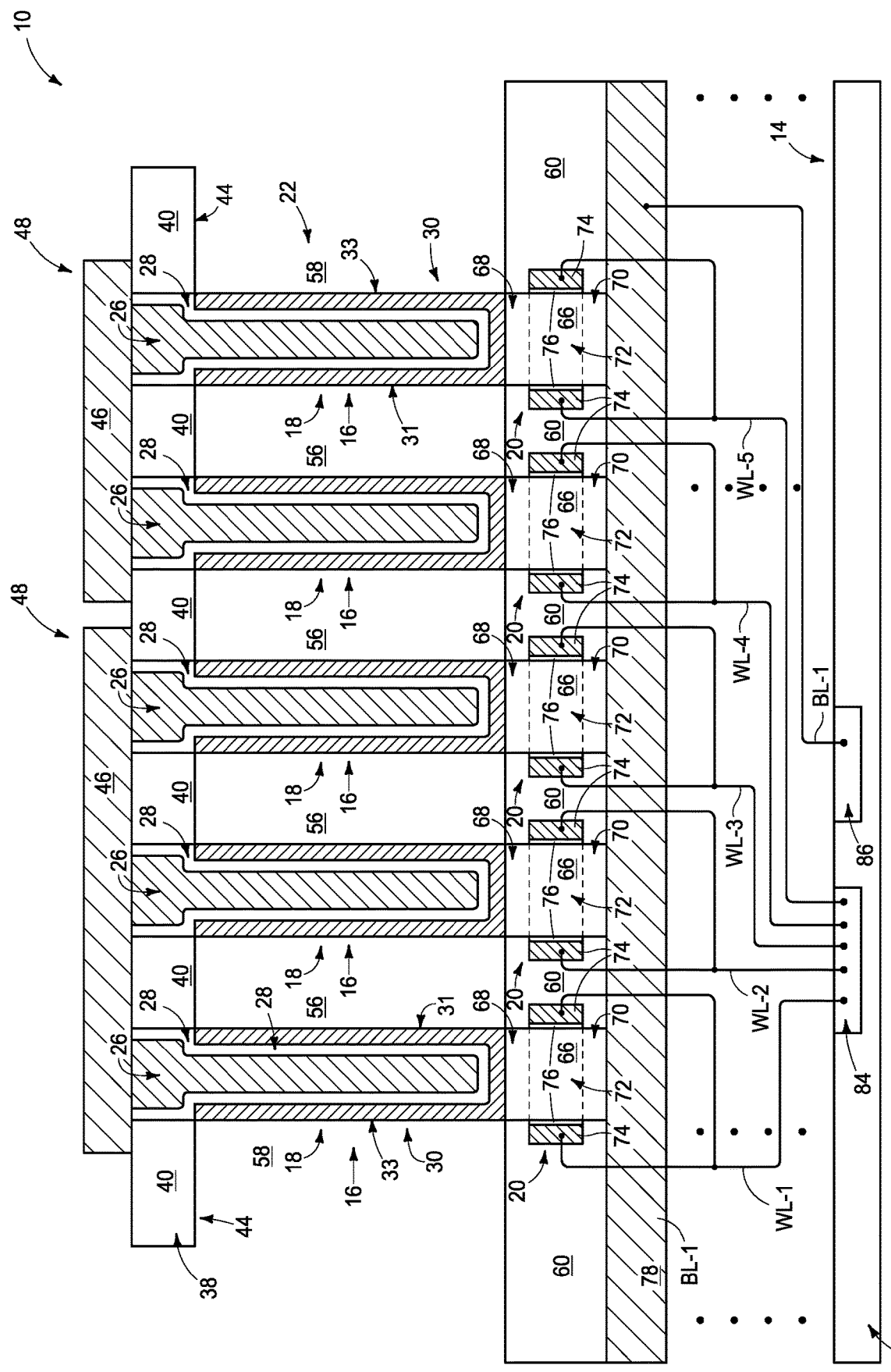

Referring to FIG. 17, the sacrificial material 202 (FIG. 16) is removed to form the first void regions 56 under the insulative beam 38, and to form the second void regions 58 along the outer surfaces 33 of the edge capacitors 30. The sacrificial material 202 may be removed with any suitable etch, including, for example, the hydrofluoric acid etch described above. In the shown embodiment, material 60 remains after removing the sacrificial material 202, but in other embodiments material 60 may also be removed so that the void regions 56/58 extend downwardly to between the wordlines (e.g., WL-1, WL-2, WL-3, WL-4 and WL-5) to form structures analogous to the structure described above with reference to FIG. 9. Further, in some embodiments the void regions 56/58 extend downwardly to between the bitlines (e.g., BL-1) to form structures analogous to the structure described above with reference to FIG. 10.

Figure 18:
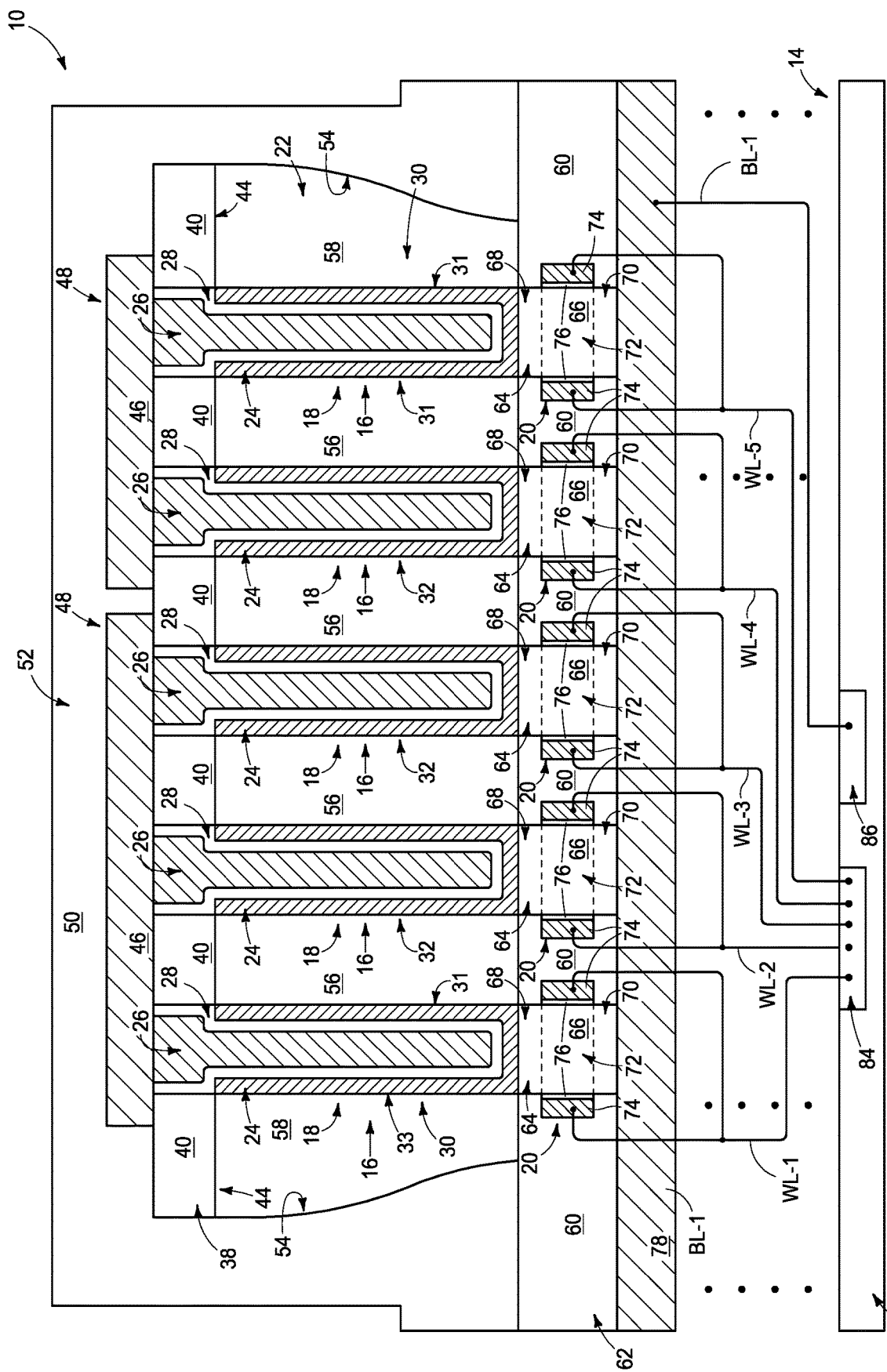

Referring next to FIG. 18, insulative material 50 is formed over the conductive plate material 46 and across insulative beam 38 to form the insulative structure 52. The insulative material 50 may be deposited utilizing any process, including, for example, a plasma-enhanced process (for instance plasma-enhanced chemical vapor deposition, PECVD). The insulative material 50 may be deposited with low (poor) step coverage to form the illustrated structure having the vertical regions 54 of the insulative structure 52 that remain spaced from the outer surfaces 33 of edge capacitors 30 by the second void regions 58.

In the embodiment of FIGS. 15-18, the sacrificial material 202 (FIG. 15) is removed subsequent to the formation of the conductive plates 48, and prior to the formation of the insulative material 50. In other embodiments, the sacrificial material 202 may be removed at other processing stages. For instance, the sacrificial material 202 may be removed prior to formation of the conductive plates 48 in some embodiments. As another example, the sacrificial material 202 may be removed after formation of the insulative material 50 in some embodiments, provided that sacrificial material 202 and insulative material 50 are of different compositions such that the sacrificial material 202 may be selectively removed relative to the insulative material 50.

The embodiment of FIG. 18 has large second void regions 58 along the outer surfaces 33 of the edge capacitors 30. Such may enable the edge capacitors 30 to have comparable electrical properties relative to the internal capacitors 32 so that the edge capacitors may be incorporated into functional memory cells 16 of the array 22. If the edge capacitors 30 do not have comparable electrical properties relative to the internal capacitors 32, the internal capacitors 32 may be incorporated into functional memory cells 16 while the edge capacitors 30 are instead incorporated into dummy devices.

Figure 19:
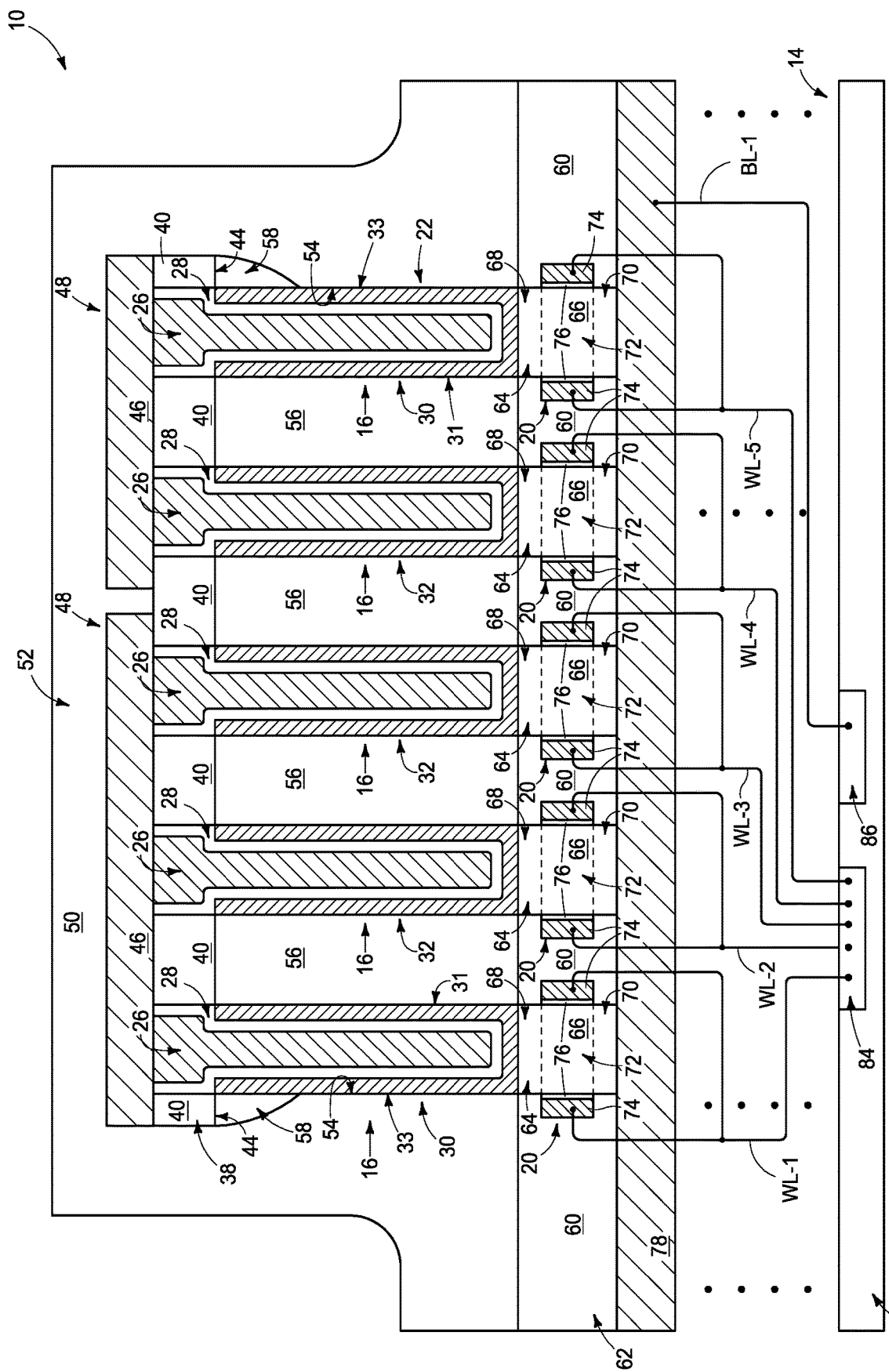
FIGS. 19-21 are diagrammatic cross-sectional side views of additional example integrated structures.
Figure 20:
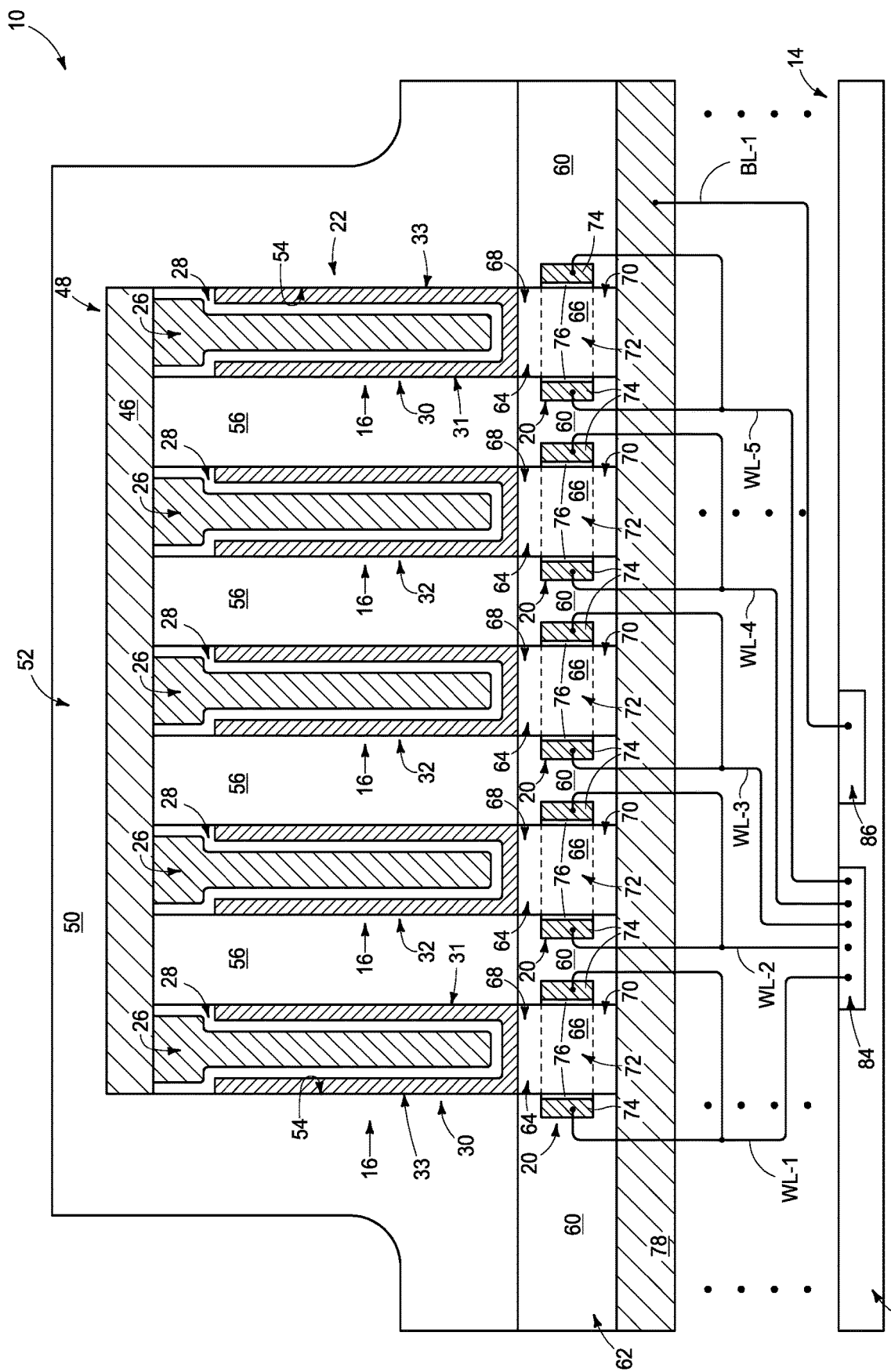

FIGS. 19 and 20 illustrate alternative embodiments in which the peripheral extensions 44 of the insulative beam 38 are reduced in size (FIG. 19) or entirely eliminated (FIG. 20, which shows an embodiment in which the entire insulative beam 38 is eliminated). The embodiments of FIGS. 19 and 20 have the first void regions 56 between the internal capacitors 32, but either entirely lack the second void regions 58 along outer surfaces 33 of the edge capacitors 30 (FIG. 20) or have much smaller void regions 58 that only extend along portions of the outer surfaces 33 (FIG. 19).

In some embodiments, the edge capacitors 30 may still have suitable electrical properties in either or both of the embodiments of FIGS. 19 and 20 to be incorporated into functional memory cells 16 of the array 22. In other embodiments, the edge capacitors 30 of either or both of the embodiments of FIGS. 19 and 20 will not have suitable electrical properties to be utilized in functional memory cells, and instead will simply be dummy structures along the edges of arrays 22.

Figure 21:
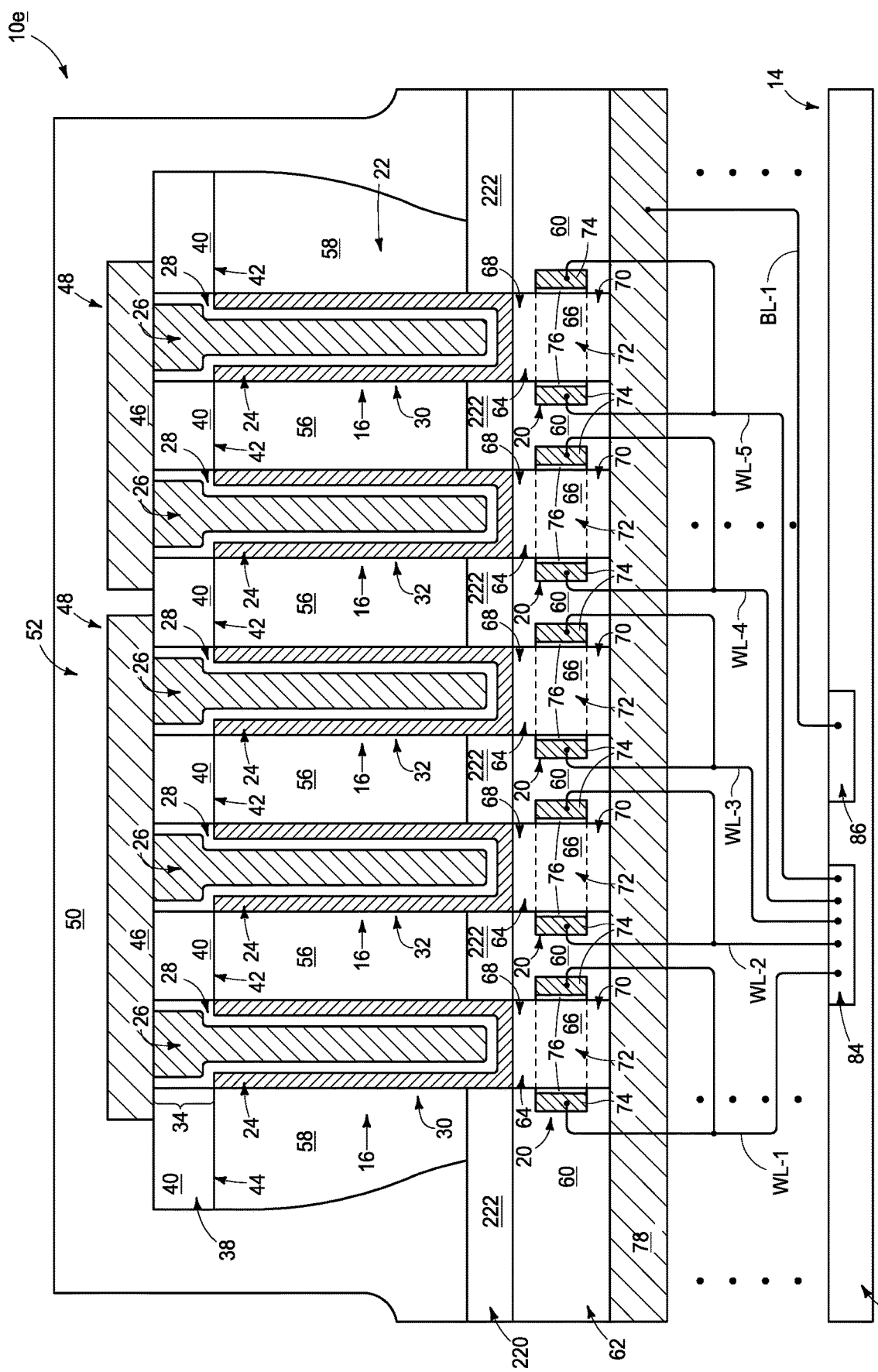

In some embodiments, it may be desired to form additional supporting lattices besides the insulative beam 38. FIG. 21 shows a construction 10e having a supporting lattice 220 along the bottoms of the capacitors 30/32 in addition to having the supporting lattice of insulative beam 38 along the tops of the capacitors 30/32. In other embodiments, other lattices may be formed between the lattice 220 and the insulative beam 38, or the lattice 220 may be replaced with another lattice that is higher up on the capacitors instead of being along the bottoms of the capacitors. The lattice 220 comprises insulative material 222. The insulative material 222 may comprise a same composition as the insulative material 40 of beam 38 in some embodiments; and may, for example, comprise, consist essentially of, or consist of silicon nitride. Utilization of multiple lattices to support the capacitors 30/32 may become increasingly advantageous as the capacitors 30/32 become increasingly tall and thin with increasing levels of integration.

The structures, arrays and assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an integrated memory which includes an array of capacitors. The array has edges, and the capacitors along the edges are edge capacitors. The capacitors that are not along the edges are internal capacitors of the array. The edge capacitors have inner edges facing toward the internal capacitors, and have outer edges in opposing relation to the inner edges. The capacitors have upper regions, and have lower regions beneath the upper regions. An insulative beam extends laterally between the capacitors. The insulative beam is along the upper regions of the capacitors. First void regions are under the insulative beam, along the lower regions of the internal capacitors, and along the inner edges of the edge capacitors. Peripheral extensions of the insulative beam extend laterally outward of at least some of the edge capacitors, and second void regions are under the peripheral extensions and along the outer edges of said at least some of the edge capacitors.

Some embodiments include an integrated memory which includes capacitors. The capacitors have first electrodes, second electrodes, and insulative capacitor material between the first and second electrodes. The capacitors have lower regions, and have upper regions over the lower regions. The capacitors are arranged in array. The array comprises edges, and the capacitors along the edges are edge capacitors. The capacitors that are not along the edges are internal capacitors of the array. the edge capacitors have inner edges facing toward the internal capacitors, and have outer edges in opposing relation to the inner edges. An insulative beam extends laterally between the capacitors. The insulative beam is along the upper regions of the capacitors. First void regions are under the insulative beam, along the lower regions of the internal capacitors, and along the inner edges of the edge capacitors. Peripheral extensions of the insulative beam extend laterally outward of the edge capacitors, and second void regions are under the peripheral extensions and along the outer edges of the edge capacitors. Transistors are under the capacitors. The transistors have first source/drain regions, second source/drain regions, and channel regions between the first and second source/drain regions. The first source/drain regions are electrically coupled with the first electrodes of the capacitors. Wordlines (i.e., access lines) are along the channel regions, and extend along rows of the array. Bitlines (i.e., digit lines) are electrically coupled with the second source/drain regions of the transistors, and extend along columns of the array. at least one conductive plate is over the array and electrically coupled with the second electrodes of the capacitors. An insulative structure is over the at least one conductive plate and has lateral edge regions extending downwardly and surrounding the array. The lateral edge regions of the insulative structure are spaced from the outer edges of the edge capacitors by the second void regions.

Some embodiments include an integrated assembly which includes a first memory array deck comprising first memory cells having first capacitors containing only non-ferroelectric insulative material; and which includes a second memory array deck comprising second memory cells having second capacitors containing ferroelectric insulative material. A base supports the first and second memory array decks.

Some embodiments include an integrated assembly which includes a first memory array deck having first transistors electrically coupled with the first capacitors in a first arrangement XTYC; where X and Y are integers, T is transistor and C is capacitor. The integrated assembly also includes second memory array deck having second transistors electrically coupled with the second capacitors in a second arrangement PTQC; where P and Q are integers, T is transistor and C is capacitor; and where P is different from X and/or Q is different from Y. A base supports the first and second memory array decks.

Some embodiments include a method of forming a memory array. An assembly is formed which comprises capacitors extending within a matrix. The capacitors have first electrodes, second electrodes, and insulative capacitor material between the first and second electrodes. The capacitors are arranged in array. The array comprises edges, and the capacitors along the edges are edge capacitors. The capacitors that are not along the edges are internal capacitors of the array. The edge capacitors have inner edges facing toward the internal capacitors, and having outer edges in opposing relation to the inner edges. The matrix includes an insulative beam over a sacrificial material. the insulative beam extends laterally between the capacitors and is along the upper regions of the capacitors. The insulative beam has peripheral extensions that extend laterally beyond the edge capacitors. The sacrificial material is removed to form first void regions under the insulative beam, along the lower regions of the internal capacitors, and along the inner edges of the edge capacitors; and to form second void regions along the outer edges of the edge capacitors. At least one conductive plate is formed over the insulative beam and is electrically coupled with the second electrodes. An insulative structure is formed over the at least one conductive plate. The insulative structure includes substantially vertical regions along the outer edges of the edge capacitors and spaced from the outer edges of the edge capacitors by the second void regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
    forming a first memory array deck at a first elevation over a base, the first memory array deck comprising a plurality of first memory cells having first capacitors containing only non-ferroelectric insulative material; and
    forming a second memory array deck at a second elevation over the base, the second elevation being different from the first elevation, the second memory array deck comprising a plurality of second memory cells having second capacitors containing ferroelectric insulative material.

2. The method of claim 1, wherein the first memory array deck is over the second memory array deck.

3. The method of claim 1, wherein the second memory array deck is over the first memory array deck.

4. The method of claim 1, wherein the first capacitors are spaced from one another by void regions.

5. The method of claim 1, wherein the second capacitors are spaced from one another by void regions.

6. The method of claim 1, wherein the first capacitors are spaced from one another by void regions of the first memory array deck, and wherein the second capacitors are spaced from one another by void regions of the second memory array deck.

7. The method of claim 1, wherein:
    the first memory cells comprise first transistors electrically coupled with the first capacitors in an arrangement XTYC; where X and Y are integers, where T is transistor and C is capacitor; and
    the second memory cells comprise second transistors electrically coupled with the second capacitors in the arrangement XTYC.

8. The method of claim 7, wherein the arrangement XTYC is 1T1C.

9. The method of claim 1, wherein:
    the first memory cells comprise first transistors electrically coupled with the first capacitors in a first arrangement XTYC; where X and Y are integers, T is transistor and C is capacitor;
    the second memory cells comprise second transistors electrically coupled with the second capacitors in a second arrangement PTQC; where P and Q are integers, T is transistor and C is capacitor; and
    wherein the second arrangement comprises a different number of transistors and/or capacitors as compared to the first memory cell arrangement.

10. The method of claim 9, wherein the first arrangement XTYC is 1T1C.

11. The method of claim 9, wherein the second arrangement PTQC is 1T1C.

12. A method of forming an integrated assembly, comprising:
    forming a first memory array deck over a base, the first memory array deck having a plurality of first transistors electrically coupled with first capacitors in a first arrangement XTYC; where X and Y are integers, T is transistor and C is capacitor;
    forming a second memory array deck having a plurality of second transistors electrically coupled with second capacitors in a second arrangement PTQC; where P and Q are integers, T is transistor and C is capacitor; where P is different from X and/or Q is different from Y; and
    wherein the first and second memory array decks are formed at different elevations over the base relative to each other.

13. The method of claim 12, wherein the first arrangement XTYC is 1T1C.

14. The method of claim 12, wherein the second arrangement PTQC is 1T1C.

15. The method of claim 12, wherein the first capacitors comprise ferroelectric insulative material and/or the second capacitors comprise ferroelectric insulative material.

* * * * *

UNITED STATES PATENT AND TRADEMARK OFFICE
CERTIFICATE OF CORRECTION

PATENT NO. : 11,107,724 B2  
APPLICATION NO. : 16/995529  
DATED : August 31, 2021  
INVENTOR(S) : Ramaswamy Page 1 of 1

It is certified that error appears in the above-identified patent and that said Letters Patent is hereby corrected as shown below:

On the Title Page

Item (62) Related U.S. Application Data, page 2, 1$^{st}$ Column, 3$^{rd}$ Line:  
Replace "7, 2018, now Pat. 10,475,697, which is a division"  
With --17, 2018, now Pat. No. 10,475,697, which is a division--

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*